US010036926B2

(12) United States Patent
Shin et al.

(10) Patent No.: US 10,036,926 B2
(45) Date of Patent: Jul. 31, 2018

(54) ARRAY SUBSTRATE AND DISPLAY DEVICE INCLUDING THE SAME

(71) Applicant: SAMSUNG DISPLAY CO., LTD., Yongin-si, Gyeonggi-do (KR)

(72) Inventors: Dong Hee Shin, Asan-si (KR); Jae Jin Song, Hwaseong-si (KR); Dong Hyeon Ki, Asan-si (KR)

(73) Assignee: Samsung Display Co., Ltd. (KR)

( * ) Notice: Subject to any disclaimer, the term of this patent is extended or adjusted under 35 U.S.C. 154(b) by 92 days.

(21) Appl. No.: 15/194,389

(22) Filed: Jun. 27, 2016

(65) Prior Publication Data

US 2017/0115518 A1 Apr. 27, 2017

(30) Foreign Application Priority Data

Oct. 22, 2015 (KR) ........................ 10-2015-0147507

(51) Int. Cl.

| | |
|---|---|
| ***G02F 1/1339*** | (2006.01) |
| ***H01L 27/12*** | (2006.01) |
| ***H01L 29/49*** | (2006.01) |
| ***G02F 1/1333*** | (2006.01) |
| *G02F 1/1362* | (2006.01) |

(52) U.S. Cl.

CPC .... *G02F 1/13394* (2013.01); *G02F 1/133345* (2013.01); *H01L 27/1248* (2013.01); *H01L 29/4908* (2013.01); *H01L 29/4916* (2013.01); *G02F 2001/13396* (2013.01); *G02F 2001/13398* (2013.01); *G02F 2001/133388* (2013.01); *G02F 2001/136222* (2013.01)

(58) Field of Classification Search

CPC ................. G02F 1/13394; G02F 2001/136222

See application file for complete search history.

(56) References Cited

U.S. PATENT DOCUMENTS

2010/0045920 A1* 2/2010 Kwak .................. G02F 1/1339 349/153
2013/0201429 A1* 8/2013 Xu .................... G02F 1/133512 349/95
2014/0118666 A1* 5/2014 Lee ..................... G02F 1/13394 349/106
2016/0320647 A1 11/2016 Shin et al.

FOREIGN PATENT DOCUMENTS

KR 10-2016-0130044 A 11/2016

* cited by examiner

*Primary Examiner* — Kendrick Hsu
(74) *Attorney, Agent, or Firm* — Innovation Counsel LLP

(57) ABSTRACT

Disclosed herein are an array substrate and a display device including the same. The array substrate includes a base substrate comprising a display area and a peripheral area; a thin-film transistor disposed in the display area of the base substrate; an insulation layer disposed in the display area of the base substrate, the insulation layer comprising a first portion covering the thin-film transistor and a second portion located on the first portion; and a first protruding pattern disposed in the peripheral area of the base substrate, wherein the first portion, the second portion and the first protruding pattern comprise the same material.

18 Claims, 28 Drawing Sheets

ARRAY SUBSTRATE AND DISPLAY DEVICE INCLUDING THE SAME

This application claims priority to Korean Patent Application No. 10-2015-0147507 filed on Oct. 22, 2015 in the Korean Intellectual Property Office, the disclosure of which is incorporated herein by reference in its entirety.

BACKGROUND

1. Field of the Invention

The present disclosure relates to an array substrate and a display device including the same.

2. Description of the Related Art

A liquid-crystal display (LCD) device is one of the most commonly used flat display devices. An LCD device includes two substrates on which field-generating electrodes such as a pixel electrode and a common electrode are formed, and a liquid-crystal layer disposed therebetween. An LCD device displays an image in such a manner that a voltage is applied to field-generating electrodes to generate an electric field across a liquid-crystal layer, and liquid-crystal molecules in the liquid-crystal layer are aligned by the electric field to control the polarization of incident light.

As LCD displays are getting a spotlight as flat display devices, much research into ways to improve display quality and reliability of LCD display devices is currently being carried out.

SUMMARY

Aspects of the present disclosure provide an array substrate with improved display quality and reliability and a display device including the array substrate.

This and other aspects, embodiments and advantages of the present disclosure will become apparent to those of ordinary skill in the art upon review of the Detailed Description and Claims to follow.

According to an exemplary embodiment of the present disclosure, an array substrate includes a base substrate comprising a display area and a peripheral area; a thin-film transistor disposed in the display area of the base substrate; an insulation layer disposed in the display area of the base substrate, the insulation layer comprising a first portion covering the thin-film transistor and a second portion located on the first portion; and a first protruding pattern disposed in the peripheral area of the base substrate, wherein the first portion, the second portion and the first protruding pattern comprise the same material.

According to an exemplary embodiment of the present disclosure, a display device includes an array substrate; an opposing substrate facing the array substrate and comprising a light-blocking member; and a liquid-crystal layer interposed between the array substrate and the opposing substrate, wherein the array substrate comprises: a first base substrate comprising a display area and a peripheral area; a thin-film transistor disposed in the display area of the base substrate; an insulation layer disposed in the display area of the base substrate, the insulation layer comprising a first portion covering the thin-film transistor and a second portion protruding from the first portion toward the opposing substrate and overlapping the light-blocking member; and a protruding pattern disposed in the peripheral area of the first base substrate and protruding toward the opposing substrate, and wherein the first portion, the second portion and the protruding pattern comprise the same material.

According to an exemplary embodiment of the present disclosure, an array substrate with improved display quality and reliability and a display device including the array substrate can be provided.

It should be noted that effects of the present disclosure are not limited to that described above and other effects of the present disclosure will be apparent to those skilled in the art from the following descriptions.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
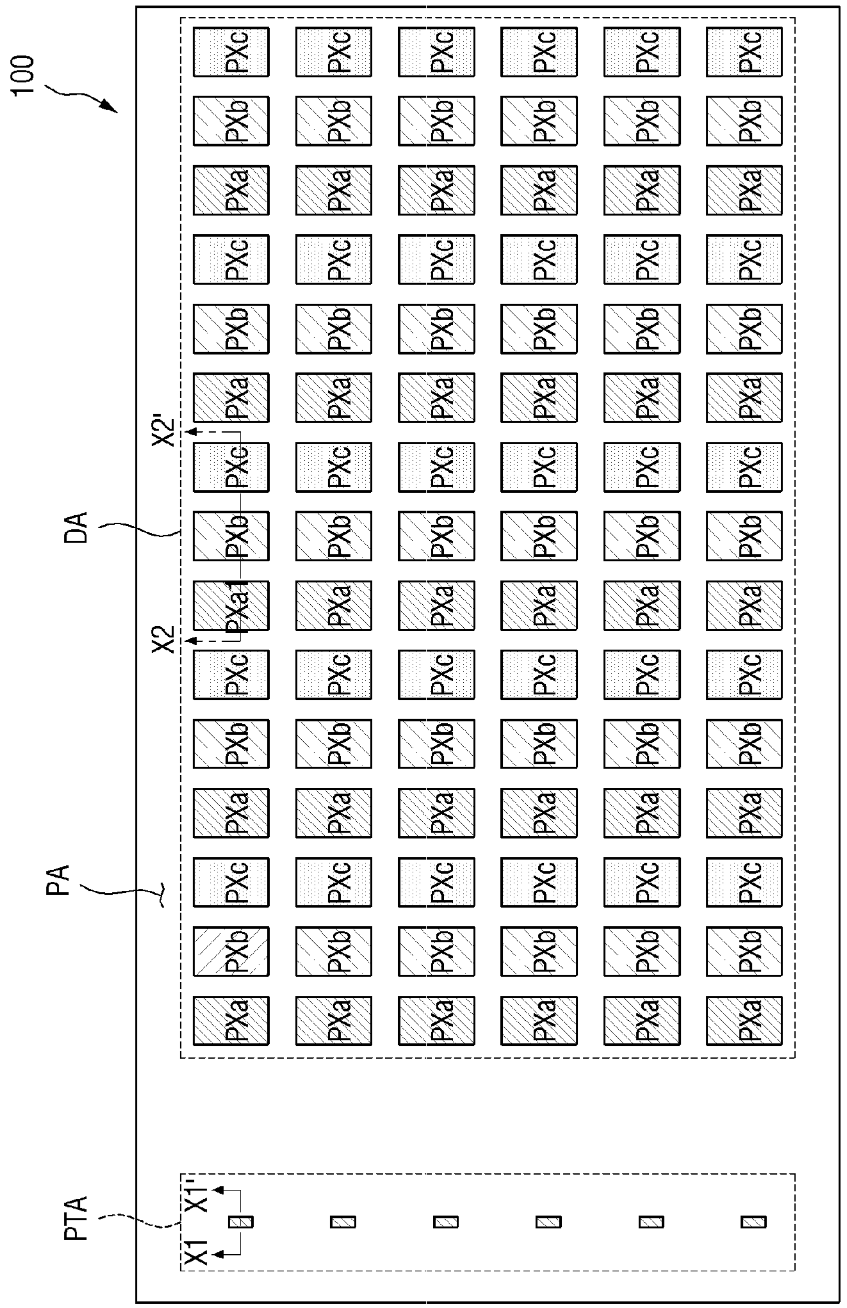
FIG. 1 is a plan view conceptually illustrating an array substrate, according to an exemplary embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the inventive concept to those skilled in the art. Like reference numerals refer to like elements throughout the specification.

The terminology used herein is for the purpose of describing particular embodiments only and is not intended to be limiting of the inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected or coupled to the other element or layer or one or more intervening elements or layers may be present. In contrast, when an element is referred to as being "directly on," "directly connected to," or "directly coupled to" another element or layer, there may be no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer or section discussed below could be termed a second element, component, region, layer, or section without departing from the teachings of the inventive concept.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations), and the spatially relative descriptors used herein may be interpreted accordingly.

Unless otherwise defined, all terms (including technical and scientific terms) used herein have the same meaning as commonly understood by one of ordinary skill in the art to which the present application belongs. It will be further understood that terms, such as those defined in commonly used dictionaries, should be interpreted as having a meaning that is consistent with their meaning in the context of the relevant art and this specification and may not be interpreted in an idealized or overly formal sense unless expressly so defined herein.

The same or similar elements are herein designated by like reference numerals. Hereinafter, exemplary embodiments of the present disclosure will be described in detail with reference to the accompanying drawings.

Figure 2:
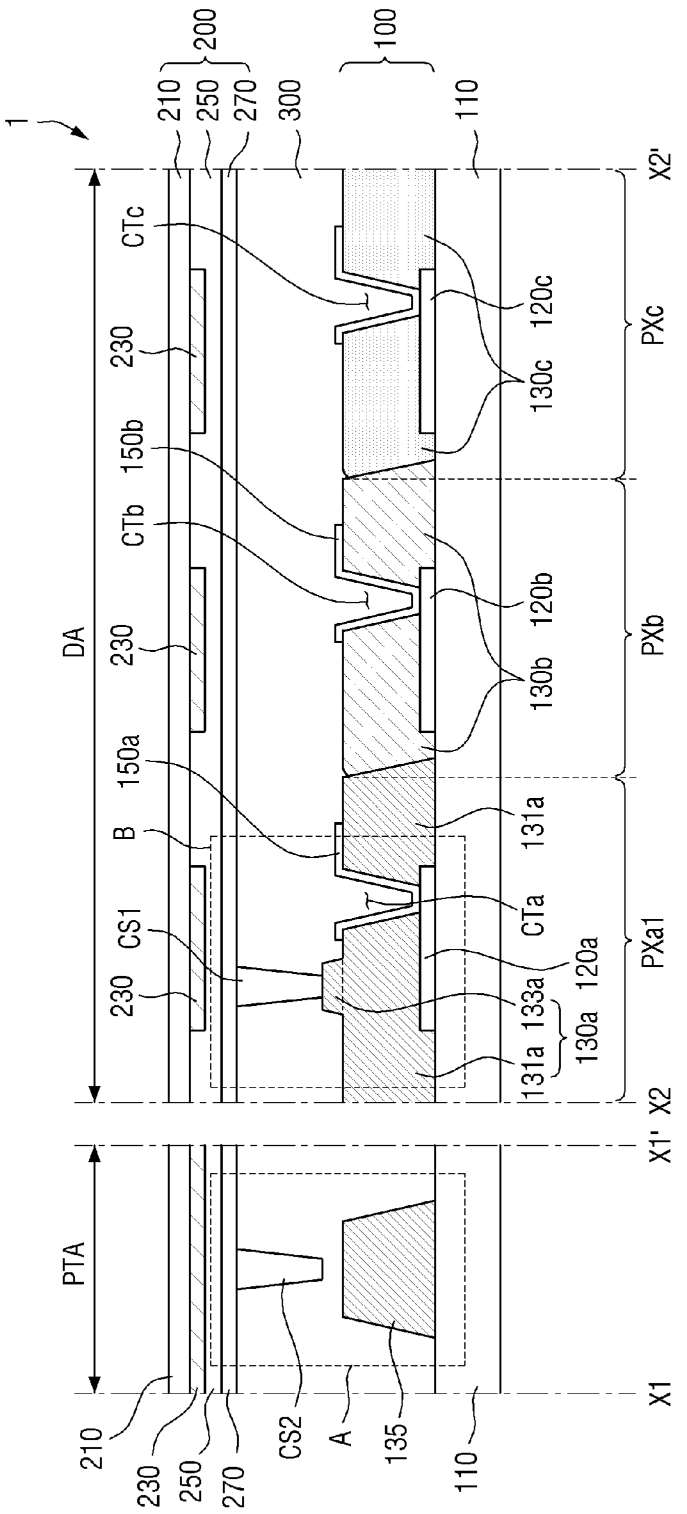
FIG. 2 is a cross-sectional view of a display device including the array substrate shown in FIG. 1, taken along lines X1-X1' and X2-X2'.
Figure 3:
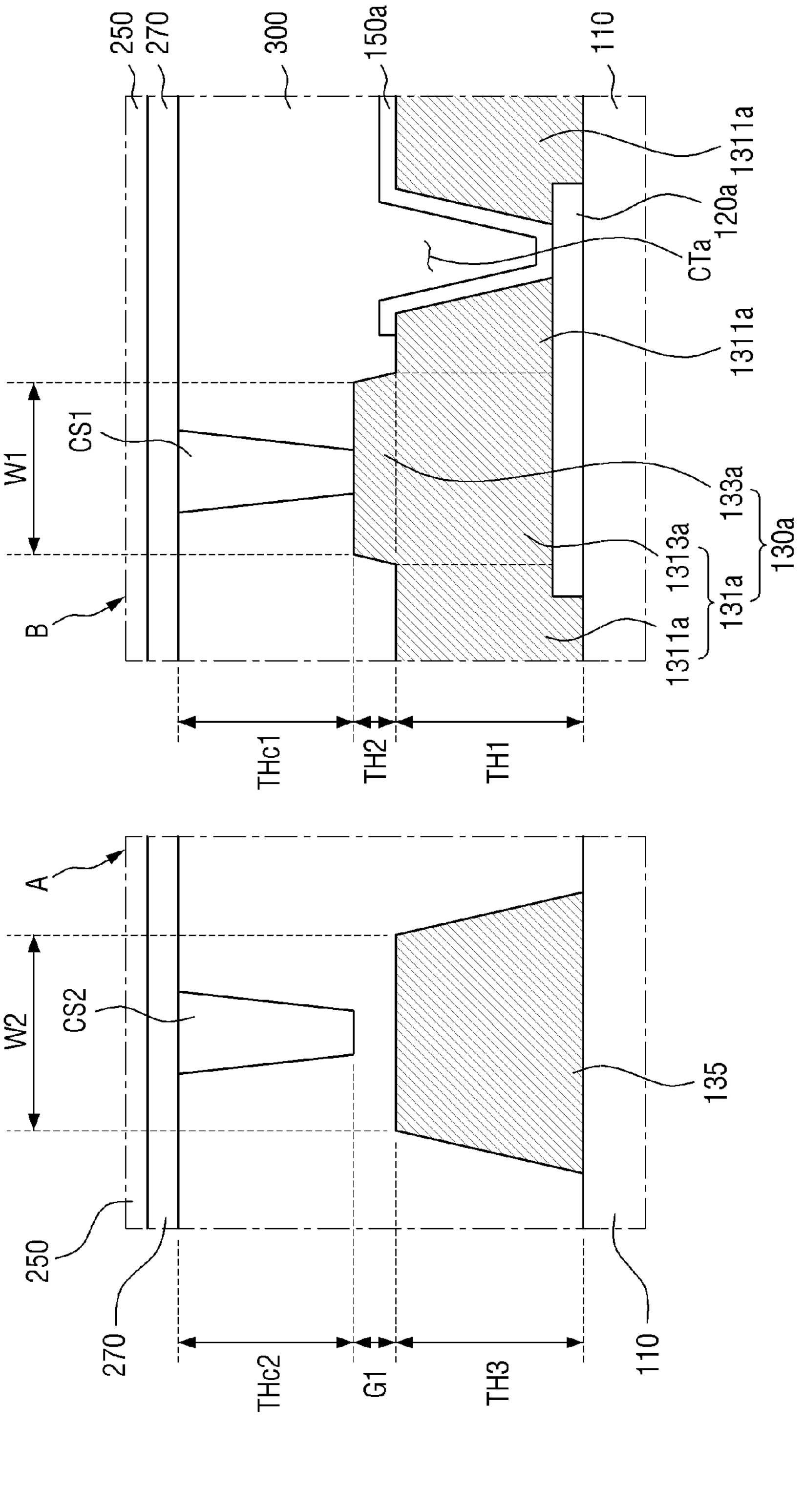
FIG. 3 is an enlarged view of portions A and B of FIG. 2.

FIG. 1 is a plan view conceptually illustrating an array substrate, according to an exemplary embodiment. FIG. 2 is a cross-sectional view of a display device including the array substrate shown in FIG. 1, taken along lines X1-X1' and X2-X2'. FIG. 3 is an enlarged view of portions A and B of FIG. 2.

Referring to FIGS. 1 to 3, a display device 1 includes an array substrate 100, an opposing substrate 200 facing the array substrate 100, and a liquid-crystal layer 300 disposed between the array substrate 100 and the opposing substrate 200. The array substrate 100 may include a first base substrate 110, a plurality of first pixels PXa, a plurality of second pixels PXb, a plurality of third pixels PXc, and at least one first protruding pattern 135.

The first base substrate 110 may be a transparent insulative substrate. For example, the first base substrate 110 may be a glass substrate, a quartz substrate, a transparent resin substrate, etc. In addition, the first base substrate 110 may include a polymer or plastic that is highly resistant to heat. In some embodiments, the first base substrate 110 may have flexibility. That is, the first base substrate 110 may be deformable so that it may be rolled, folded, bent, and so on.

The first base substrate 110 may include a display area DA in which the plurality of first pixels PXa, the plurality of second pixels PXb, and the plurality of third pixels PXc are disposed, and a peripheral area PA at the periphery of the display area DA.

The display area DA refers to an area where images are displayed, while the peripheral area PA refers to an area where no image is displayed. In some embodiments, wirings or components necessary for displaying images may be disposed in the peripheral area PA.

Although the peripheral area PA is shown as being located on the outer side of the display area DA in the drawings, the present disclosure is not limited thereto. In addition, although the peripheral area PA is shown as surrounding the display area DA in the drawings when viewed from the top, the present disclosure is not limited thereto. In some embodiments, the peripheral area PA may surround only a part of the display area DA.

The plurality of first pixels PXa, the plurality of second pixels PXb, and the plurality of third pixels PXc may display different colors. In an exemplary embodiment, the plurality of first pixels PXa may display a first color, the plurality of second pixels PXb may display a second color that is different from the first color, and the plurality of third pixels PXc may display a third color that is different from the first and second colors.

The plurality of first pixels PXa, the plurality of second pixels PXb, and the plurality of third pixels PXc may be arranged in various manners. In the following description, for convenience of illustration, the first pixels PXa, the second pixels PXb, and the third pixels PXc are arranged in this order in the horizontal direction and the same kind of pixels are arranged in the vertical direction, as shown in FIG. 1. However, this is merely illustrative. In an alternative embodiment, the pixels arranged in the vertical direction may not be of the same kind of pixels. That is, the pixels included in a column may not be of the same kind of the pixels. For example, the first pixel column may include a second pixel PXb and/or a third pixel PXc in addition to the first pixel PXa.

The plurality of pixels PXa, PXb, and PXc located on the first base substrate 110 may include thin-film transistors 120*a*, 120*b*, and 120*c*, respectively. For example, each of the first pixels PXa may include the first thin-film transistor 120*a*, each of the second pixels PXb may include the second thin-film transistor 120*b*, and each of the third pixels PXc may include the third thin-film transistor 120*c*. Although not shown specifically in the drawings, gate wirings for transferring gate signals and data wirings for transferring data signals may be formed on the first base substrate 110. For example, the gate wirings may include gate lines extended in a row direction and gate electrodes protruding from the gate lines. In addition, a semiconductor pattern may be disposed on each of the gate electrodes. In addition, the data wirings may include data lines extended in a column direction, source electrodes, and drain electrodes. Each of the source electrode branches off from the data lines to be extended over the gate electrode and the semiconductor pattern, and each of the drain electrodes is separated from the source electrode to be formed above the gate electrode and the semiconductor pattern such that the drain electrode faces the corresponding source electrode.

The structure of thin-film transistors 120*a*, 120*b*, and 120*c* each including a gate insulation film formed on a gate electrode, a semiconductor pattern formed on the gate insulation film above the gate electrode, and the like is well known in the art; therefore, description thereof will not be made.

The plurality of pixels PXa, PXb, and PXc located on the first base substrate 110 may include insulation layers 130*a*, 130*b*, and 130*c* disposed on the thin-film transistors 120*a*, 120*b*, and 120*c*, respectively. For example, a particular pixel PXa1 among the plurality of first pixels PXa may include a first insulation layer 130*a* disposed on a first thin-film transistor 120*a* to cover it. A second pixel PXb may include a second insulation layer 130*b* disposed on a second thin-film transistor 120*b* to cover it. The third pixel PXc may include a third insulation layer 130*c* disposed on a third thin-film transistor 120*c* to cover it.

The insulation layers 130*a*, 130*b*, and 130*c* may include a photosensitive material. The photosensitive material may be a photosensitive organic material. In some embodiments, the insulation layers 130*a*, 130*b*, and 130*c* may include a negative photosensitive material that becomes harder when exposed to light, or a positive photosensitive material that becomes soluble when exposed to light. In the following description, the insulation layers 130*a*, 130*b*, and 130*c* include a negative photosensitive material for convenience of illustration.

In some embodiments, the insulation layers 130*a*, 130*b*, and 130*c* may include color pigments. For example, the first insulation layer 130*a* may include a first color pigment transmitting a light having the wavelength of a first color. The second insulation layer 130*b* may include a second color pigment transmitting a light having the value of a second color different from the first color. The third insulation layer 130*c* may include a third color pigment transmitting a light having the wavelength of a third color different from the first and second colors. In an exemplary embodiment, the first color may be one of red, green and blue, the second color may be another of red, green and blue, and the third color may be the other of red, green and blue. The first insulation layer 130*a*, the second insulation layer 130*b*, and the third insulation layer 130*c* may transmit lights having particular wavelength ranges so that the first pixel PXa, the second pixel PXb, and the third pixel PXc display their own colors, respectively. That is, the first insulation layer 130*a*, the second insulation layer 130*b*, and the third insulation layer 130*c* may be color filters.

The first insulation layer 130*a* included in the first pixel PXa1 among the plurality of first pixels PXa may include a first portion 131*a* and a second portion 133*a*. The first portion 131*a* may be located on the first base substrate 110 and may cover the first thin-film transistor 120*a*. The second portion 133*a* may be located on the first portion 131*a* and may protrude therefrom toward the opposing substrate 200. The others of the plurality of first pixels PXa than the first pixel PXa1 may not include the above-described second portion 133*a*. That is, the others of the plurality of first pixels PXa than the first pixel PXa1 may include only insulation layers that are substantially similar to the first portion 131*a*.

The first portion 131*a* and the second portion 133*a* may be made of the same material and may be formed as a single piece. In some embodiments, the second portion 133*a* may have an island shape when viewed from the top. That is, the second portion 133*a* may be an island-like pattern formed on the first portion 131*a*. The second portion 133*a* may overlap the first thin-film transistor 120*a*. Specifically, the second portion 133*a* may be located on the top of the first portion 131*a* above the first thin-film transistor 120*a*. Accordingly, the second portion 133*a* may be covered by a light-blocking member 230, which will be described below.

The first portion 131*a* may be divided into a non-overlapping portion 1311*a* that the second portion 133*a* does not overlap, and an overlapping portion 1313*a* that the second portion 133*a* overlaps. The hardness of the non-overlapping portion 1311*a* may be lower than the hardness of the overlapping portion 1311*a*. As will be described below, the overlapping portion 1313*a* is exposed to light twice, that is, a twice-exposed part. As will be described below, the overlapping portion 1311*a* is exposed to light once, that is, a once-exposed part. As the overlapping portion 1313*a* is exposed a greater number of times than the non-overlapping portion 1311*a*, the overlapping portion 1313*a* may be harder than the non-overlapping portion 1311*a*. In some embodiments, the second portion 133*a* may be harder than the non-overlapping portion 1311*a* of the first portion 131*a*. Similarly to the overlapping portion 1313*a*, the second portion 133*a* may be exposed to light a greater number of times than the non-overlapping portion 1311*a*. Accordingly, the second portion 133*a* may be harder than the non-overlapping portion 1311*a*.

At least one first protruding pattern 135 may be formed in the peripheral area PA of the first base substrate 110. The first protruding pattern 135 may be disposed at a predetermined area in the peripheral area PA. In the following description, the predetermined area is referred to as a "peripheral pattern area PTA" for convenience of illustration.

The first protruding pattern 135 may protrude toward the opposing substrate 200. The first protruding pattern 135 may be made of the same material as that of one of the first insulation layer 130*a*, the second insulation layer 130*b*, and the third insulation layer 130*c*. In one embodiment, the first protruding pattern 135 may be made of the same material as the first insulation layer 130*a* including a first color pigment. For example, if the first insulation layer 130*a* includes a red pigment, the first protruding pattern 135 may also include a red pigment. Similarly, if the first insulation layer 130*a* includes a green pigment, the first protruding pattern 135 may also include a green pigment. Similarly, if the first insulation layer 130*a* includes a blue pigment, the first protruding pattern 135 may also include a blue pigment.

The first protruding pattern 135 may have an island shape when viewed from the top. That is, the first protruding pattern 135 may be an island-like pattern formed in the peripheral area PA of the first base substrate 110. If the first protruding pattern 135 has an island shape, liquid crystal molecules introduced between the array substrate 100 and the opposing substrate 200 can spread out more quickly and evenly. That is, the liquid crystal molecules in the liquid-crystal layer 300 can spread better.

In some embodiments, the shape of the first protruding pattern 135 may be substantially similar to the shape of the second portion 133*a* when viewed from the top. For example, if the second portion 133*a* has a circular or polygonal shape, the first protruding pattern 135 may also have a circular or polygonal shape when viewed from the top. The first protruding pattern 135 and the second portion 133*a* may be formed using the same mask pattern. Accordingly, the shape of the first protruding pattern 135 may be substantially similar to the shape of the second portion 133*a* when viewed from the top. In addition, in some embodiments, the width W1 of the second portion 133*a* may be substantially equal to the width W2 of the first protruding pattern 135. The width W2 of the first protruding pattern 135 may be shown as being larger than the width W1 of the second portion 133*a* in FIG. 3 and some drawings because the first protruding pattern 135 is exaggerated in the drawings.

In some embodiments, the hardness of the first protruding pattern 135 may be lower than the hardness of the overlapping portion 1313*a* of the first portion 131*a*. The overlapping portion 1313*a* may be exposed to light a greater number of times than the first protruding pattern 135 during the fabricating process. As a result, the overlapping portion 1313*a* may be harder than the first protruding pattern 135. Similarly, the hardness of the first protruding pattern 135 may be lower than the hardness of the second portion 133*a*.

The sum of the thickness TH1 of the first portion 131*a* and the thickness TH2 of the second portion 133*a* may be larger than the thickness TH3 of the first insulation pattern 135. For example, the height from the top surface of the first base substrate 110 to the top surface of the first insulation pattern 135 may be smaller than the height from the top surface of the first base substrate 110 to the top surface of the second portion 133*a*. That is, the top surface of the second portion 133*a* may be closer to the opposing substrate 200 than the top surface of the first protruding pattern 135. In some embodiments, the thickness TH1 of the first portion 131*a* may be substantially equal to the thickness TH3 of the first protruding pattern 135. The first insulation layer 130*a* and the first protruding pattern 135 may be formed by patterning the same photosensitive material layer. In some embodiments, the number of times the non-overlapping portion 1313*a* of the first portion 131*a* of the first insulation layer 130*a* is exposed to the light during a pattering process may be equal to the number of times the first protruding pattern 135 is exposed to the light.

The plurality of pixels PXa, PXb, and PXc may include pixel electrodes 150*a*, 150*b*, and 150*c* located on the insulation layers 130*a*, 130*b*, and 130*c*, respectively. A first pixel electrode 150*a* may be located on the first insulation layer 130*a* of one of the first pixels PXa or the first pixel PXa1, and the first pixel electrode 150*a* may be electrically connected to the first thin-film transistor 120*a* via a first contact hole CTa. Likewise, a second pixel electrode 150*b* may be located on the second insulation layer 130*b* of the second pixel PXb, and the second pixel electrode 150*b* may be electrically connected to the second thin-film transistor 120*b* via a second contact hole CTb. A third pixel electrode 150*c* may be located on the third insulation layer 130*c* of the third pixel PXc, and the third pixel electrode 150*c* may be electrically connected to the third thin-film transistor 120*c* via a third contact hole CTc. In some embodiments, the first to third pixel electrodes 150*a*, 150*b*, and 150*c* may be made of a transparent conductive material such as ITO, IZO, ITZO, and AZO.

The opposing substrate 200 may include a second base substrate 210, a light-blocking member 230, an overcoat layer 250, a common electrode 270, in addition to a first spacing member CS1, a second spacing member CS2, etc. Like the first base substrate 110, the second base substrate 210 may be a transparent insulative substrate. The second base substrate 210 may include a polymer or plastic that is highly resistant to heat. In some embodiments, the second base substrate 210 may have flexibility.

The light-blocking member 230 may be located on a surface of the second substrate 210 facing the first base substrate 100. The light-blocking member 230 may work as a film for blocking light, and may be formed at a location corresponding to the peripheral area PA of the first base substrate 110. The light-blocking member 230 may overlap the first thin-film transistor 120*a*, the second thin-film transistor 120*b*, and the third thin-film transistor 120*c*. As described above, the second portion 133*a* may overlap the first thin-film transistor 120*a*, and thus the light-blocking member 230 may overlap the second portion 133*a* as well. The light-blocking member 230 may be made of an opaque material such as chrome (Cr), and can prevent light leakage to improve the quality of the display device.

The overcoat layer 250 may be formed on the second base substrate 210 and the light-blocking member 230 and may cover the light-blocking member 230. The overcoat layer 250 may planarize level differences created by the light-blocking member 230. In some embodiments, the overcoat layer 250 may be eliminated.

The common electrode 270 may be located on the overcoat layer 250. In some embodiments, if the overcoat layer 250 is eliminated, the common electrode 270 may be located on the second base substrate 210 and the light-blocking member 230. The common electrode 270 may be made of a transparent conductive material such as ITO, IZO, etc., and may be formed throughout the entire surface of the second base substrate 210 to be shared by the pixels. A common voltage $V_{com}$ may be applied to the common electrode 270, so that the common electrode 270 along with each of the pixel electrodes 150*a*, 150*b*, and 150*c* may generate an electric field.

The first spacing member CS1 may be disposed between the second base substrate 210 and the array substrate 100 at a location corresponding to the display area DA of the first base substrate 110. In some embodiments, the first spacing member CS1 may be located on the common electrode 270.

In some embodiments, the first spacing member CS1 may be disposed at a location corresponding to the second portion 133*a* and may overlap the second portion 133*a*. The first spacing member CS1 may contact with the second portion 133*a* and may works as a main spacer for maintaining a gap between the array substrate 100 and the opposing substrate 200.

The second spacing member CS2 may be disposed between the second base substrate 210 and the array substrate 100 at a location corresponding to the peripheral area PA of the first base substrate 110. In some embodiments, the second spacing member CS2 may be located on the common electrode 270.

In some embodiments, the second spacing member CS2 may be disposed at a location corresponding to the first protruding pattern portion 135 and may overlap the first protruding pattern 135. The second spacing member CS2 may be spaced apart from the first protruding pattern 135 by a first gap G1. Accordingly, the second spacing member CS2 may work as a sub spacer for the first protruding pattern 135. The first spacing member CS1 and the second spacing member CS2 may include a photosensitive material and may be produced by a photolithography process.

In some embodiments, the thickness THc1 of the first spacing member CS1 may be substantially equal to the thickness THc2 of the second spacing member CS2. The distance from the top surface of the common electrode 270 to the end of the first spacing member CS1 may be substantially equal to the distance from the top surface of the common electrode 270 to the end of the second spacing member CS2. Accordingly, the fabricating processes can be simpler compared to the fabricating processes performed by using a halftone mask or the like to form the first spacing member CS1 and the second spacing member CS2 having different thicknesses.

FIGS. 4 to 22 are views for illustrating processes of fabricating the array substrate of the display device, according to the exemplary embodiment shown in FIGS. 1 to 3. Specifically, FIGS. 4, 6, 8, 10, 12, 14, 16 and 18 are plan views for illustrating process of fabricating the array substrate of the display device. FIGS. 5, 7, 9, 11, 13, 15, 17 and 19 to 22 are schematic cross-sectional views for illustrating process of fabricating the array substrate of the display device. The lines of the cross-sectional views of FIGS. 5, 7, 9, 11, 13, 16, 17 and 19 to 22 are drawn at the same locations as those of lines X1-X1' and X2-X2' shown in FIG. 1. The locations are also indicated in FIGS. 4, 6, 8, 10, 12, 14, 16 and 18 as well.

Figure 4:
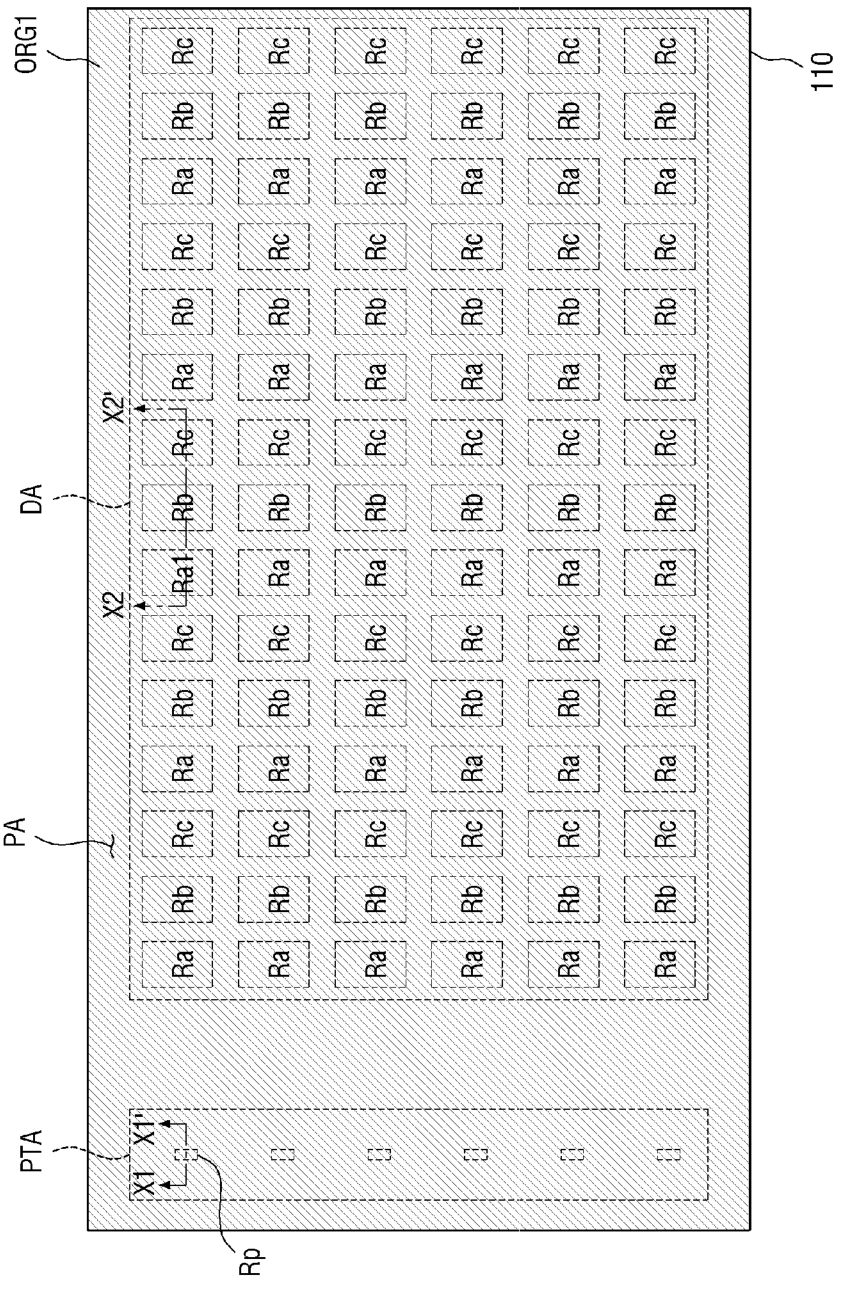
FIGS. 4 to 22 are views for illustrating processes of fabricating the array substrate and the display device, according to the exemplary embodiment shown in FIGS. 1 to 3.
Figure 5:
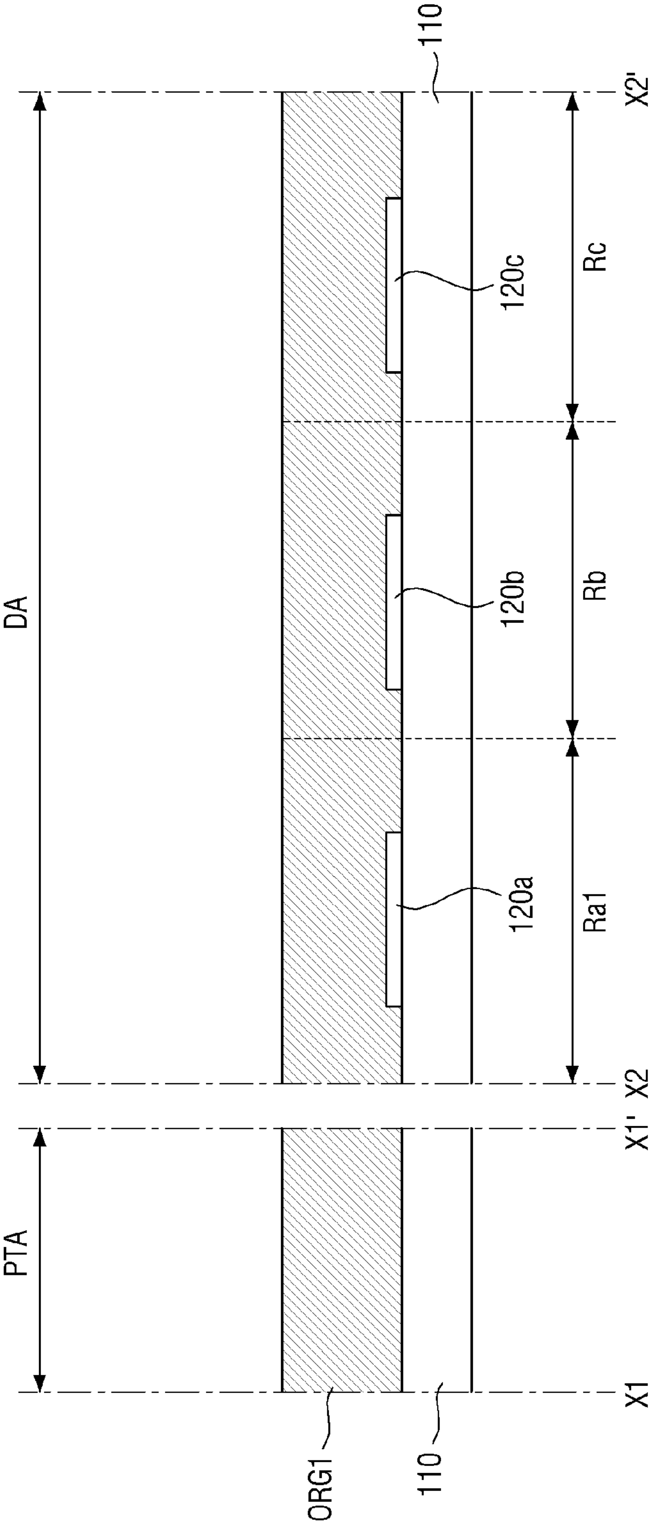

Initially, referring to FIGS. 4 and 5, a first base substrate 110 including a display area DA and a peripheral area PA is prepared. The display area DA may include a plurality of first pixel regions Ra, a plurality of second pixel regions Rb, and a plurality of third pixel regions Rc. In the first pixel regions Ra, the first pixels PXa described above with respect to FIGS. 1 to 3 are located. In the second pixel regions Rb, the second pixels PXb described above with respect to FIGS. 1 to 3 are located. In the third pixel regions Rc, the third pixels PXc described above with respect to FIGS. 1 to 3 are located.

In a particular pixel region among the plurality of first pixel regions Ra, the first pixels PXa1 described above with respect to FIGS. 1 to 3 may be formed. In the following description, the particular pixel region is referred to as a “first particular pixel region Ra1” for convenience of illustration.

Insulation pattern regions Rp may exist in the peripheral area PA. In the insulation pattern regions Rp, the first protruding pattern 135 described above with respect to FIGS. 1 to 3 are formed. More than one insulation pattern regions Rp may exist. Multiple insulation pattern regions Rp may form a peripheral pattern area PTA.

Subsequently, first thin-film transistors 120*a*, second thin-film transistors 120*b*, and third thin-film transistors 120*c* are formed in the first pixel regions Ra, the second pixel regions Rb, and the third pixel regions Rc of the first base substrate 110, respectively. A first photosensitive material layer ORG1 is formed on the first base substrate 110. The first photosensitive material layer ORG1 may be formed in the peripheral area PA of the first base substrate 110, in addition to the display area DA. That is, the first photosensitive material layer ORG1 may be formed throughout the entire surface of the first base substrate 110 and may cover the first thin-film transistors 120*a*, the second thin-film transistors 120*b*, and the third thin-film transistors 120*c*. The first photosensitive material layer ORG1 may include a photosensitive material and may include a first color pigment. For example, the photosensitive material may be either a negative photosensitive material or a positive photosensitive material. In the following description, the first photosensitive material layer ORG1 includes a negative photosensitive material for convenience of illustration.

Figure 6:
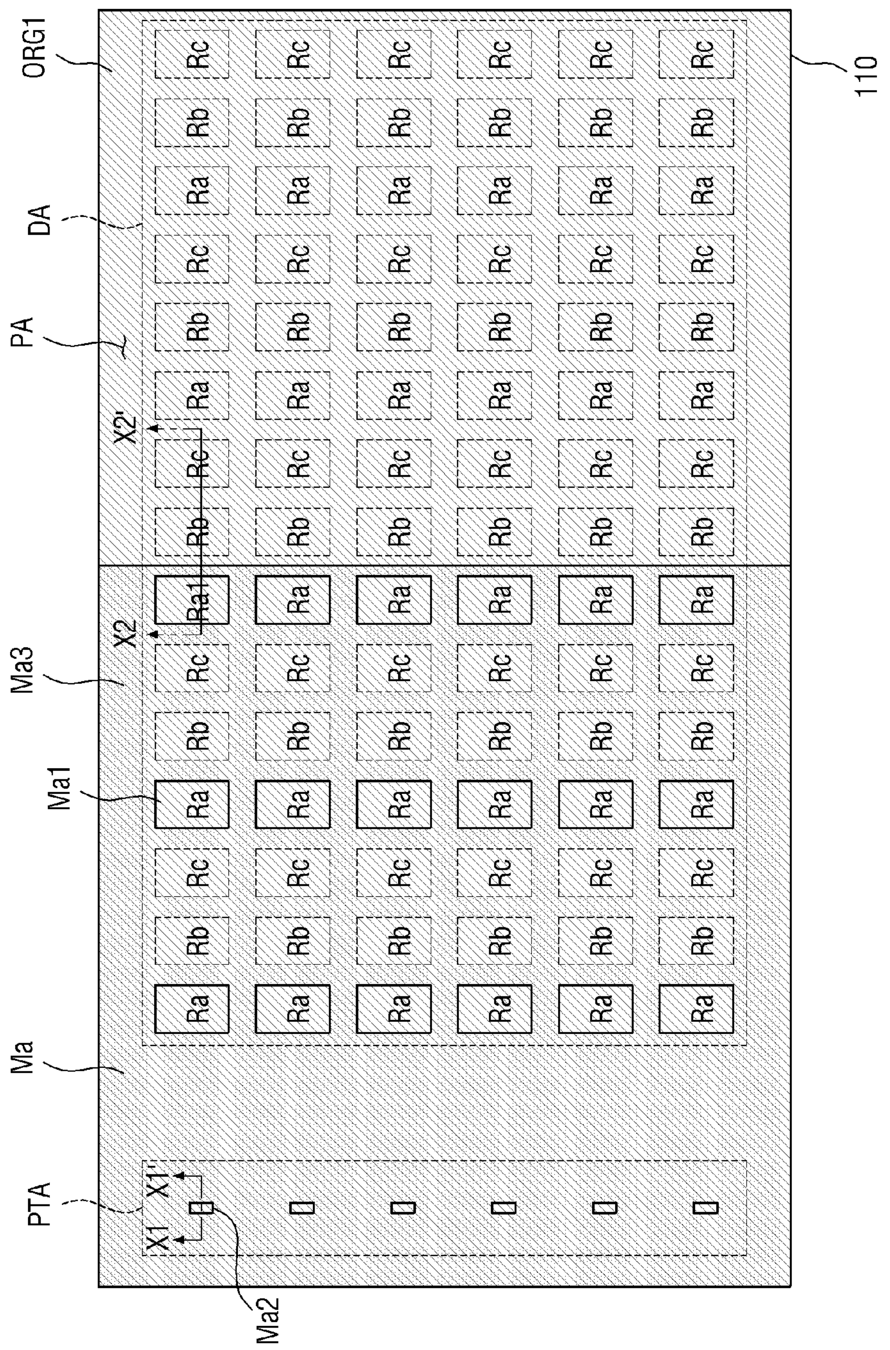
Figure 7:
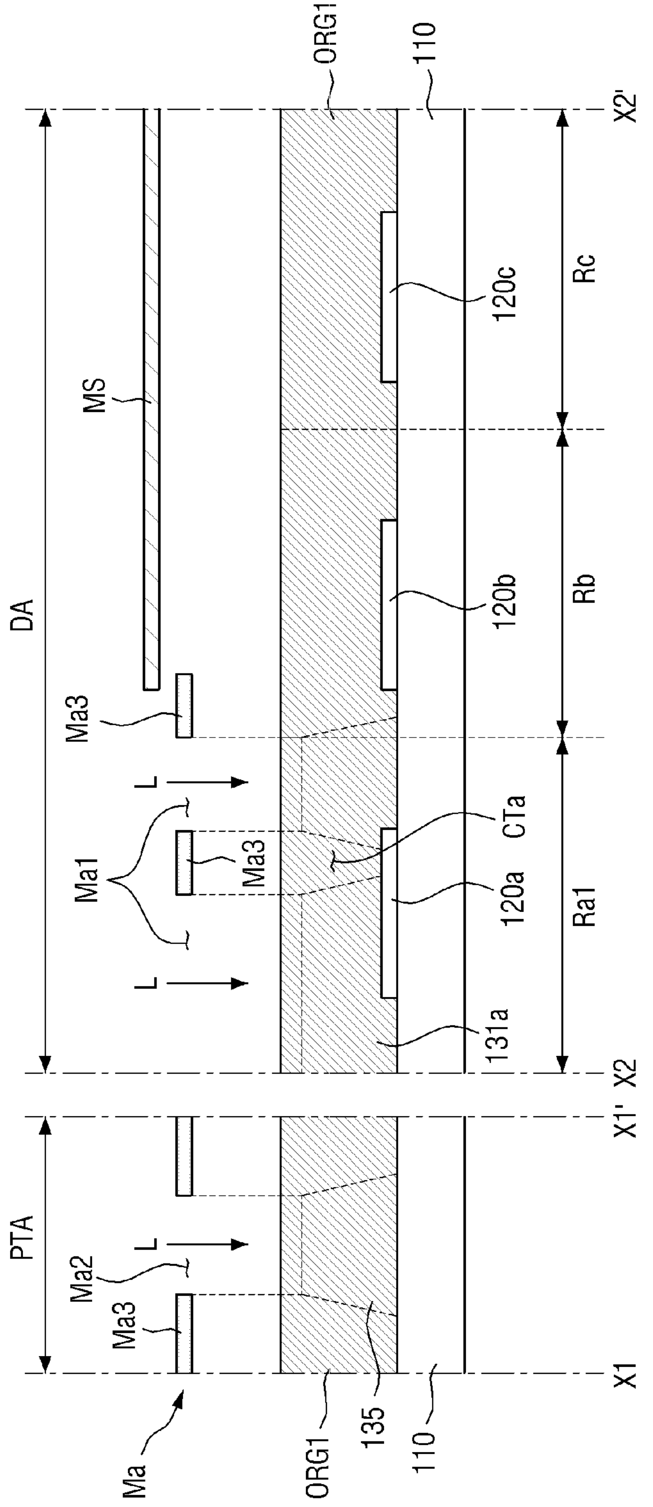

Subsequently, referring to FIGS. 6 and 7, a first mask Ma is placed above the first base substrate 110. The first mask Ma may be smaller than the first base substrate 110. In this case, a pattern is formed by performing exposure processes several times on the first base substrate 110 part by part. That is, exposure processes may be performed by dividing the first base substrate 110 into several parts.

The first mask Ma may include a first pattern Ma1 corresponding to a first pixel region Ra, and a second pattern Ma2 corresponding to an insulation pattern region Rp. The first pattern Ma1 and the second pattern Ma2 may transmit light. In addition, the first mask Ma may include a first light-blocking part Ma3 that corresponds to the rest part other than the first pattern Ma1 and the second pattern Ma2.

The first mask Ma is placed above the first base substrate 110 so that the first pattern Ma1 is aligned with the first pixel region Ra while the second pattern Ma2 is aligned with the insulation pattern region Rp. Then, light L such as ultraviolet ray is irradiated onto the first base substrate 110 from above the first mask Ma, thereby curing the first photosensitive material layer ORG1.

A part of the first photosensitive material layer ORG1 cured by the irradiation in the insulation pattern region Rp becomes the first protruding pattern 135. A part of the first photosensitive material layer ORG1 cured by the irradiation in the first particular pixel region Ra1 among the first pixel regions Ra becomes the first portion 131*a* of the first insulation layer 130*a* (see FIG. 2). In addition, in some embodiments, a part of the first portion 131*a* where a first contact hole CTa is to be formed may be covered by the first light-blocking part Ma3 so that it is not cured. Optionally, an additional light-blocking mask MS may be used during the process of irradiating light to cover a part of the first base substrate 110 that does not overlap the first mask Ma.

Figure 8:
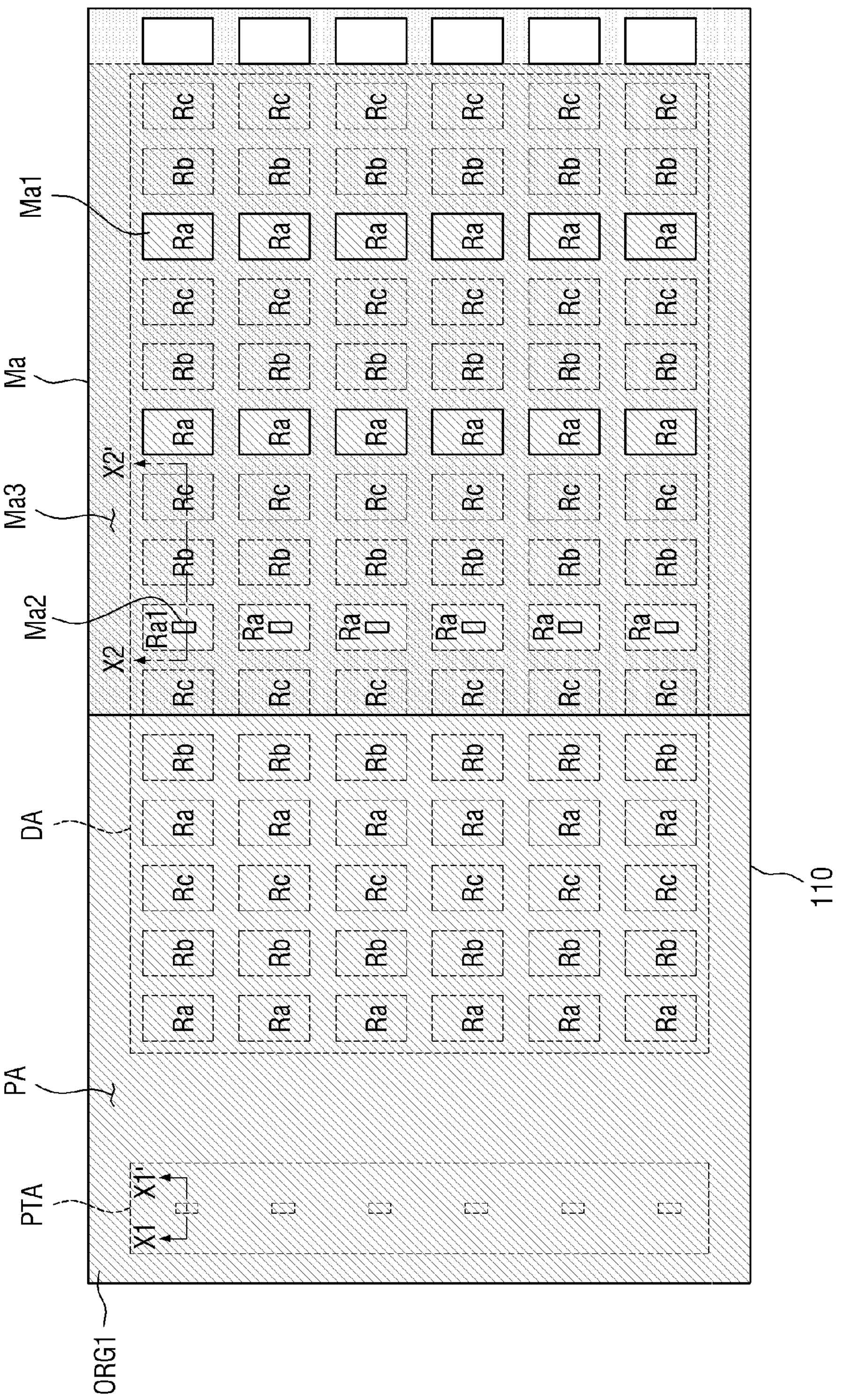
Figure 9:
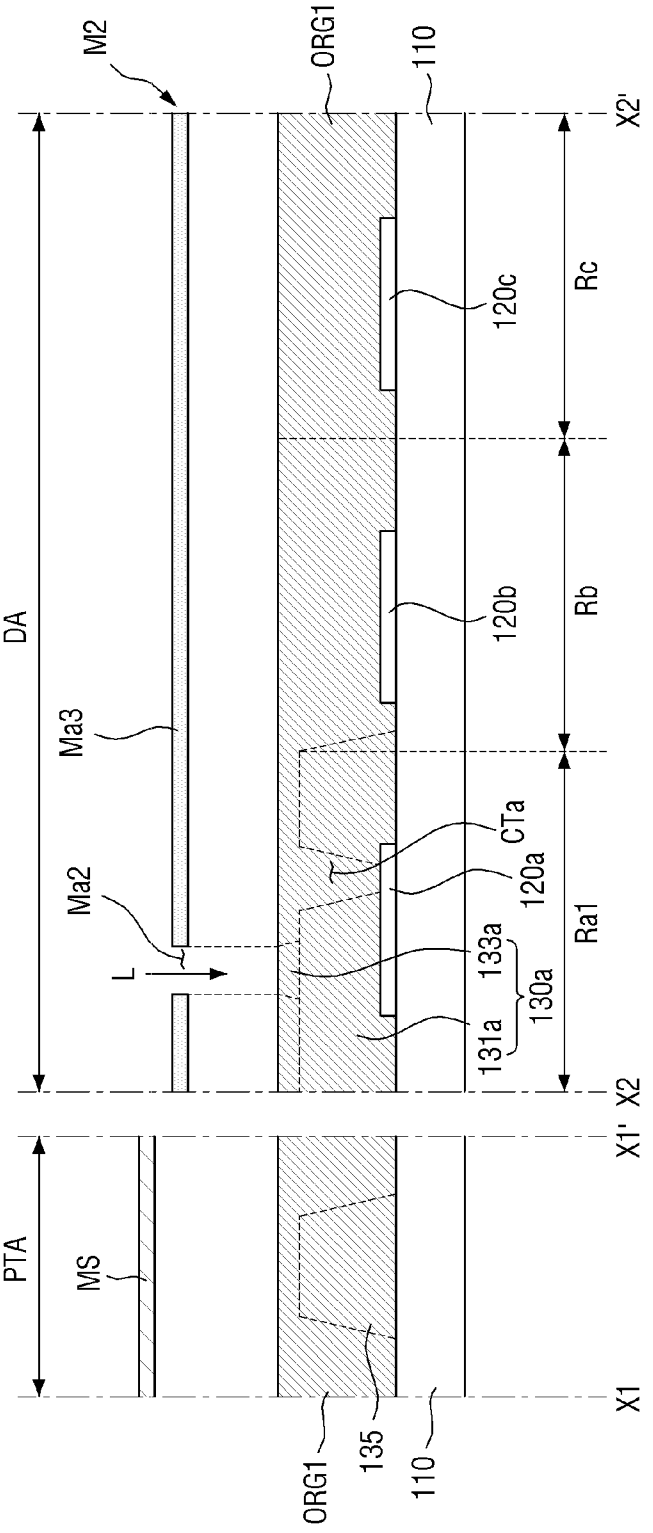

Subsequently, referring to FIGS. 8 and 9, the first mask Ma is moved so that the first pattern Ma1 is aligned with an area of the first pixel region Ra onto which light is not irradiated. At this time, the second pattern Ma2 is aligned with the first particular pixel region Ra1 among the first pixel regions Rate, onto which light has been irradiated.

Then, light L such as ultraviolet ray is irradiated onto the first base substrate 110 from above the first mask Ma, thereby curing the first photosensitive material layer ORG1. In doing so, the part of the first photosensitive material layer ORG1 in the first particular pixel region Ra1 has already been exposed to the light via the first pattern Ma1, and may be exposed to the light one more time via the second pattern Ma2. Consequently, the part of the first photosensitive material layer ORG1 in the first particular pixel region Ra1 includes a part that has been exposed to the light once via the first pattern Ma1 (hereinafter referred to as an once-exposed part), and a part that has been exposed to the light twice via the first pattern Ma1 and the second pattern Ma2 (hereinafter referred to as a twice-exposed part). A part of the twice-exposed part may become the second portion 133*a* of the first insulation layer 130*a* (see FIG. 2). Since the twice-exposed part is exposed to the light more than the once-exposed part, the former may be harder than the latter.

Similarly, the part of the first photosensitive material layer ORG1 in the insulation pattern region Rp may be exposed to the light once via the second pattern Ma2. Accordingly, the part of the first photosensitive material layer ORG1 in the insulation pattern region Rp may be less harder than the twice-exposed part.

Figure 10:
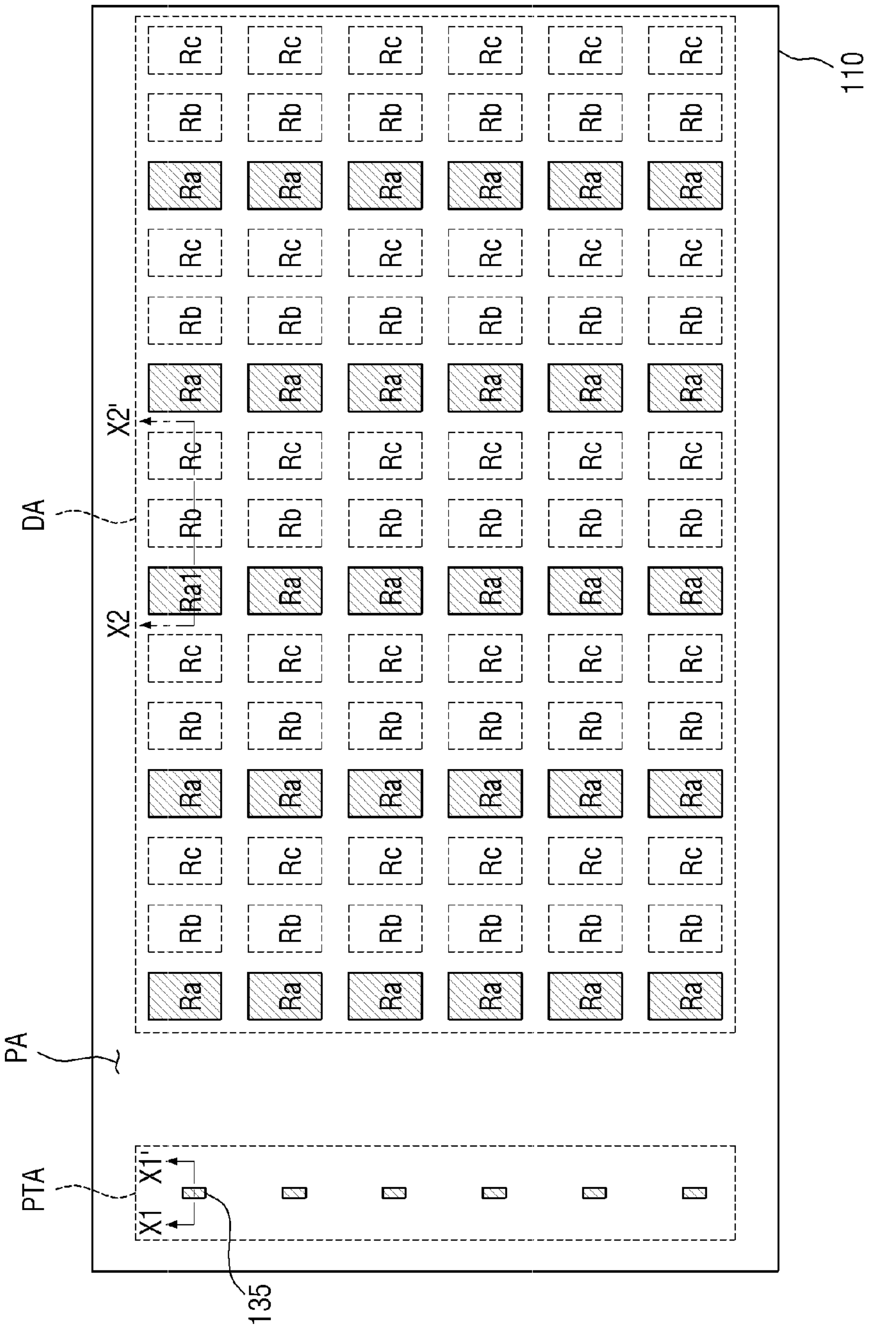
Figure 11:
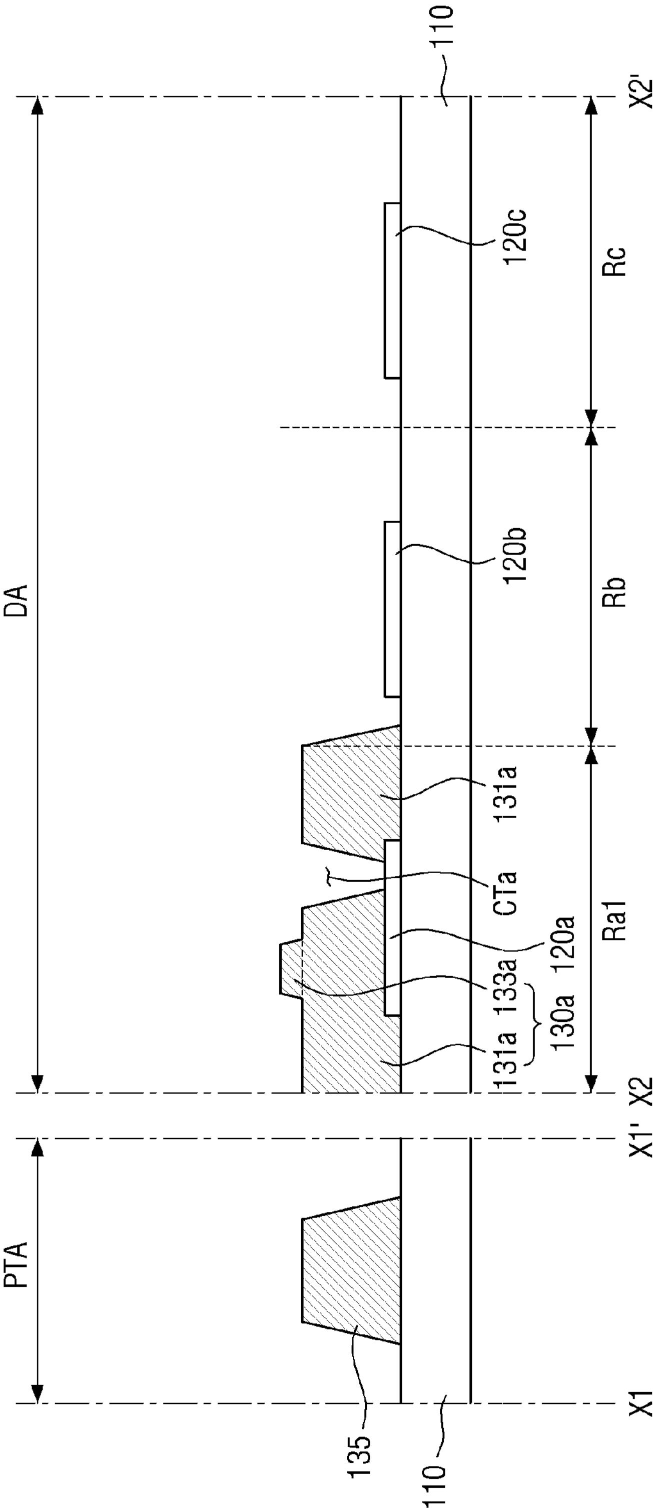

Subsequently, a part of the first photosensitive material layer ORG1 that is not cured or not exposed to the light is removed, such that the first protruding pattern 135 and the first insulation layer 130*a* shown in FIGS. 10 and 11 can be formed. Additionally, a first contact hole CTa may be formed to expose a part of the first thin-film transistor 120*a*.

Subsequently, referring to FIGS. 12 and 13, a second photosensitive material layer ORG2 is formed throughout the entire surface of the first base substrate 110. That is, the second photosensitive material layer ORG2 may cover the first thin-film transistors 120*a*, the second thin-film transistors 120*b*, the third thin-film transistors 120*c*, the first protruding pattern 135, and the first insulation layer 130*a*. The second photosensitive material layer ORG2 may include a photosensitive material and may include a second color pigment having a second color that is different from the first color of the first photosensitive material layer ORG1. Like the first photosensitive material layer ORG1, the photosensitive material may be either a negative photosensitive material or a positive photosensitive material. In the following description, the second photosensitive material layer ORG2 includes a negative photosensitive material for convenience of illustration.

Figure 14:
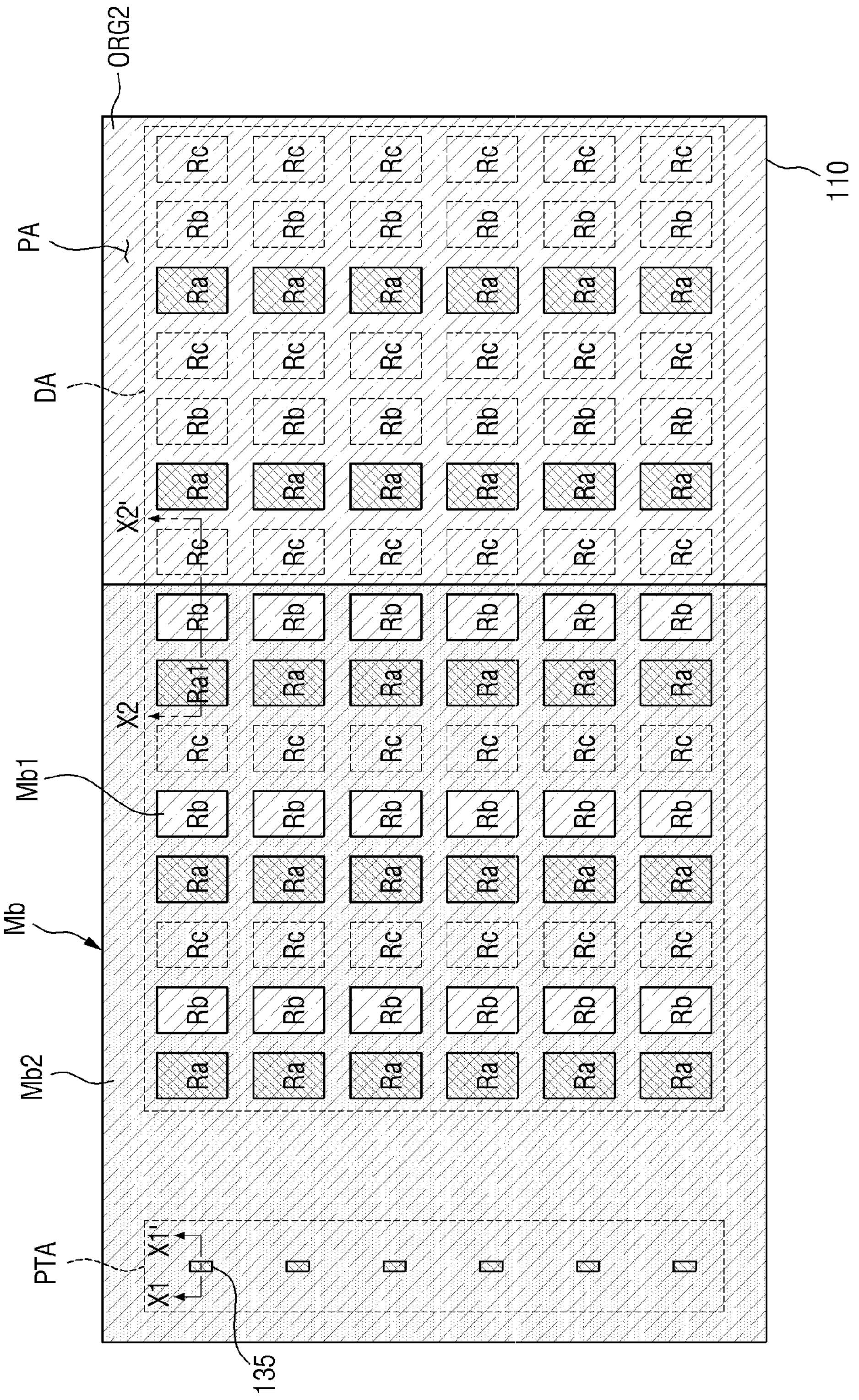
Figure 15:
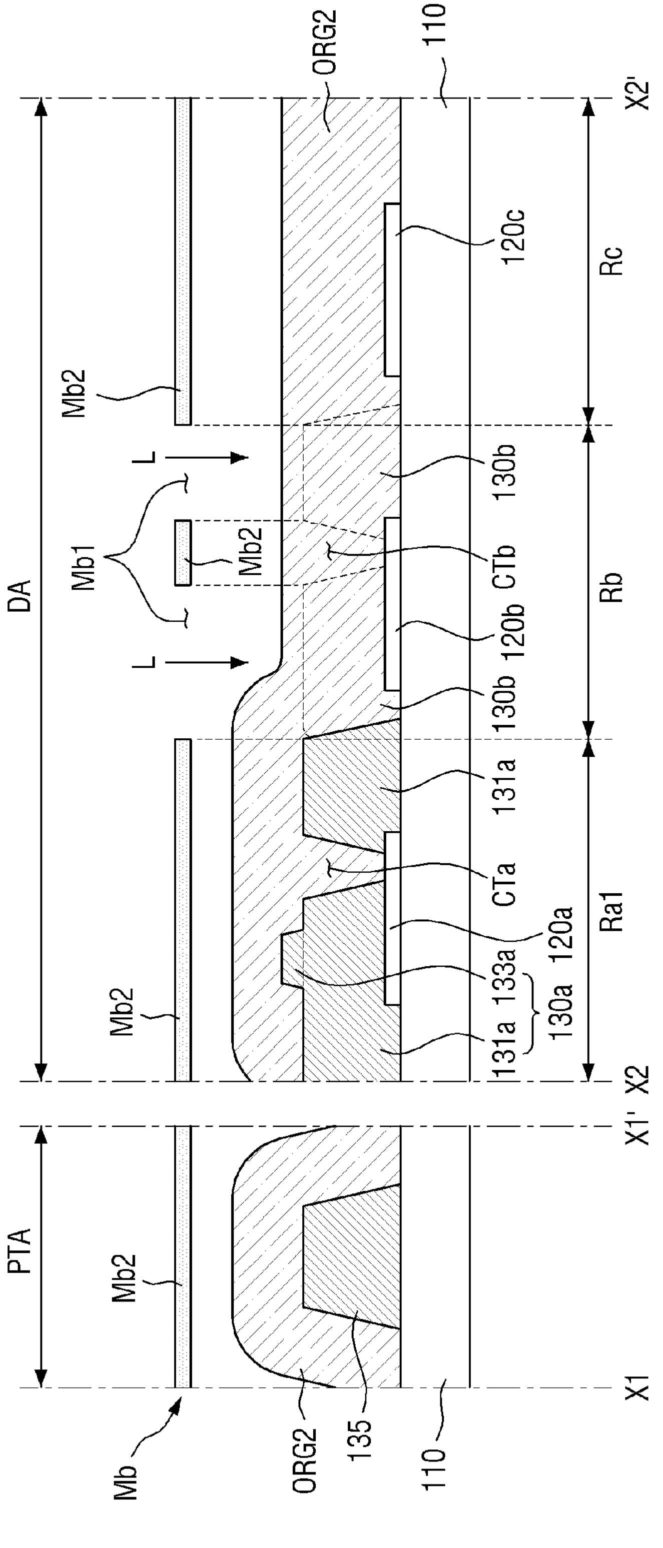

Subsequently, referring to FIGS. 14 and 15, a second mask Mb is placed above the first base substrate 110. Similar to the first mask Ma, the second mask Mb may be smaller than the first base substrate 110. Accordingly, a pattern is formed on the first base substrate 110 by performing exposure processes several times on the second photosensitive material layer ORG2 on the first base substrate 110 part by part.

The second mask Mb may include a third pattern Mb1 corresponding to the second pixel region Rb. The third pattern Mb1 may transmit light. In addition, the second mask Mb may include a second light-blocking part Mb2 that corresponds to the rest part other than the third pattern Mb1.

The second mask Mb is placed above the first base substrate 110 so that the third pattern Mb1 is aligned with the second pixel region Rb. Then, light L such as ultraviolet ray is irradiated onto the first base substrate 110 from above the second mask Mb, thereby curing the second photosensitive material layer ORG2.

A part of the second photosensitive material layer ORG2 cured by the irradiation in the second pixel region Rb becomes the second insulation layer 130*b*. In addition, in some embodiments, a part of the second insulation light 130*b* where a second contact hole CTb is to be formed may be covered by the second light-blocking part Mb2 so that it is not cured. Optionally, an additional light-blocking mask MS may be used during the process of irradiating light to cover a part of the first base substrate 110 that does not overlap the second mask Mb.

Figure 16:
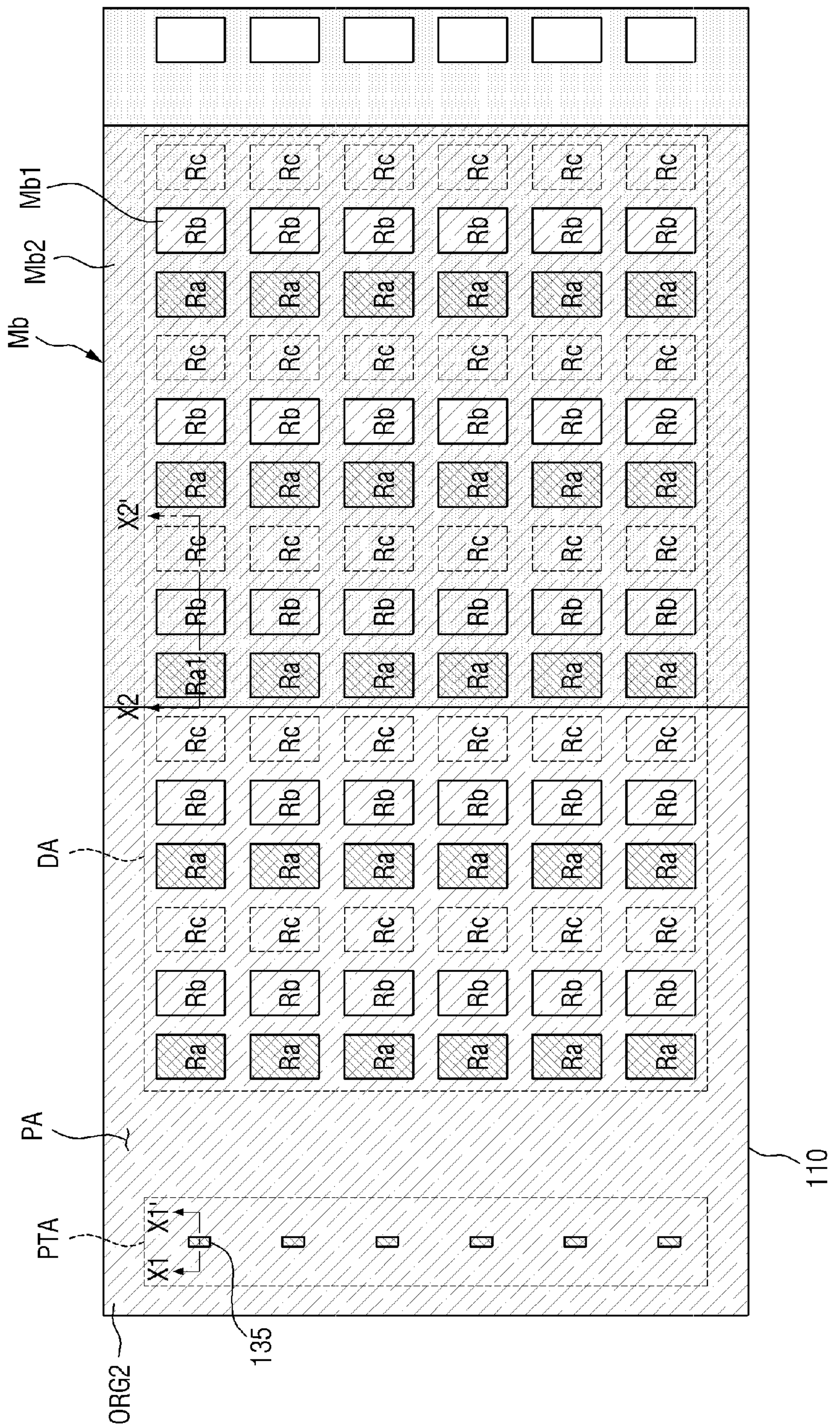
Figure 17:
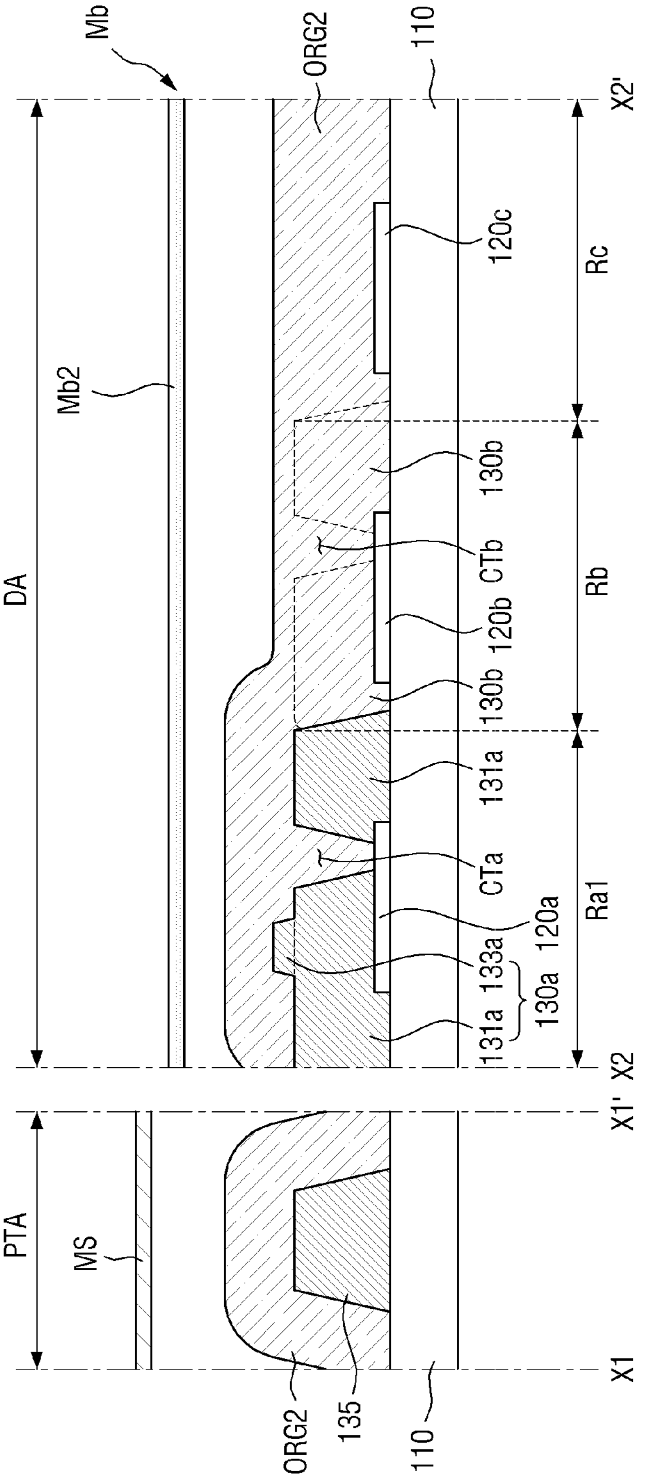

Subsequently, referring to FIGS. 16 and 17, the second mask Mb is moved so that the third pattern Mb1 is aligned with an area of the second pixel region Rb onto which light is not irradiated. Then, light L such as ultraviolet ray is irradiated onto the first base substrate 110 from above the second mask Mb, thereby curing the second photosensitive material layer ORG2.

Figure 18:
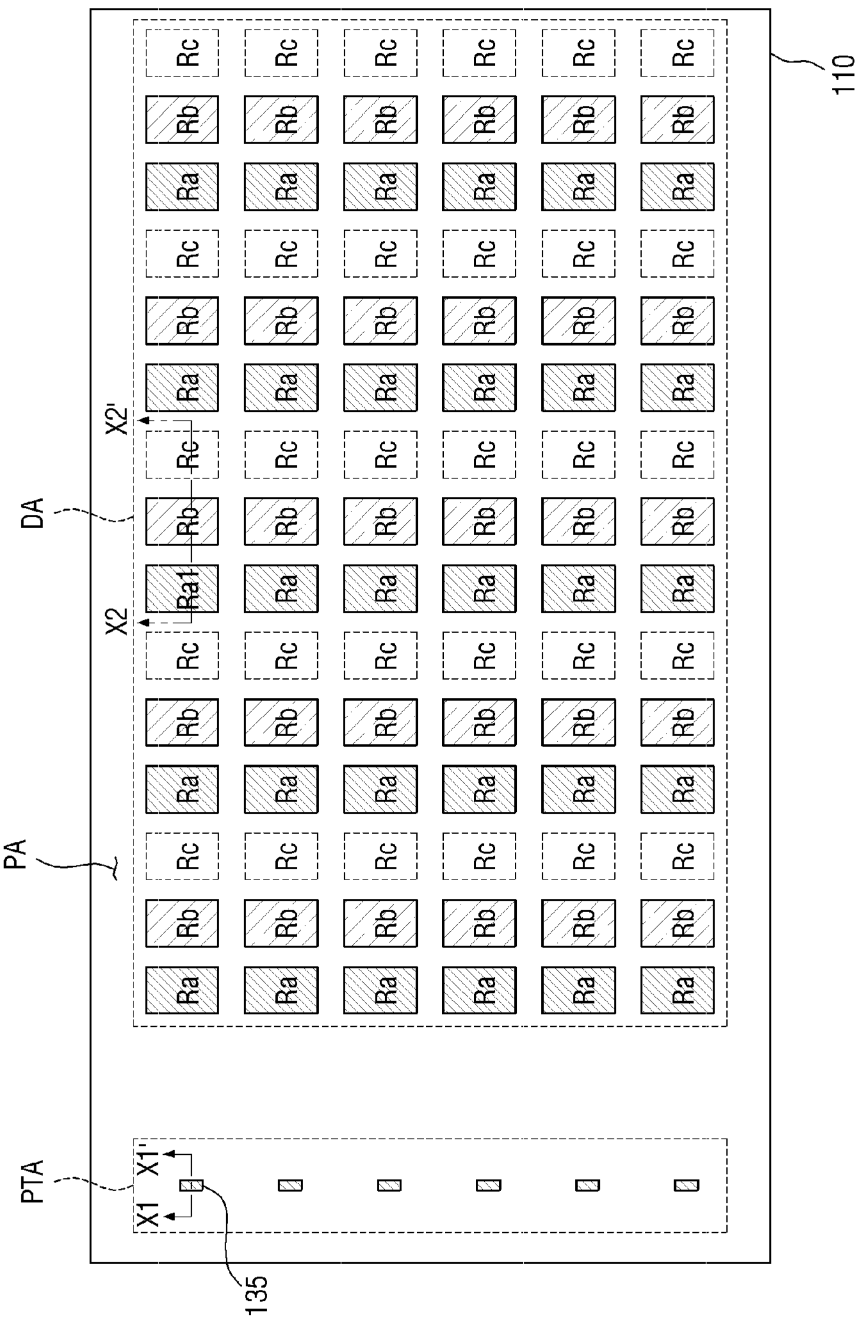
Figure 19:
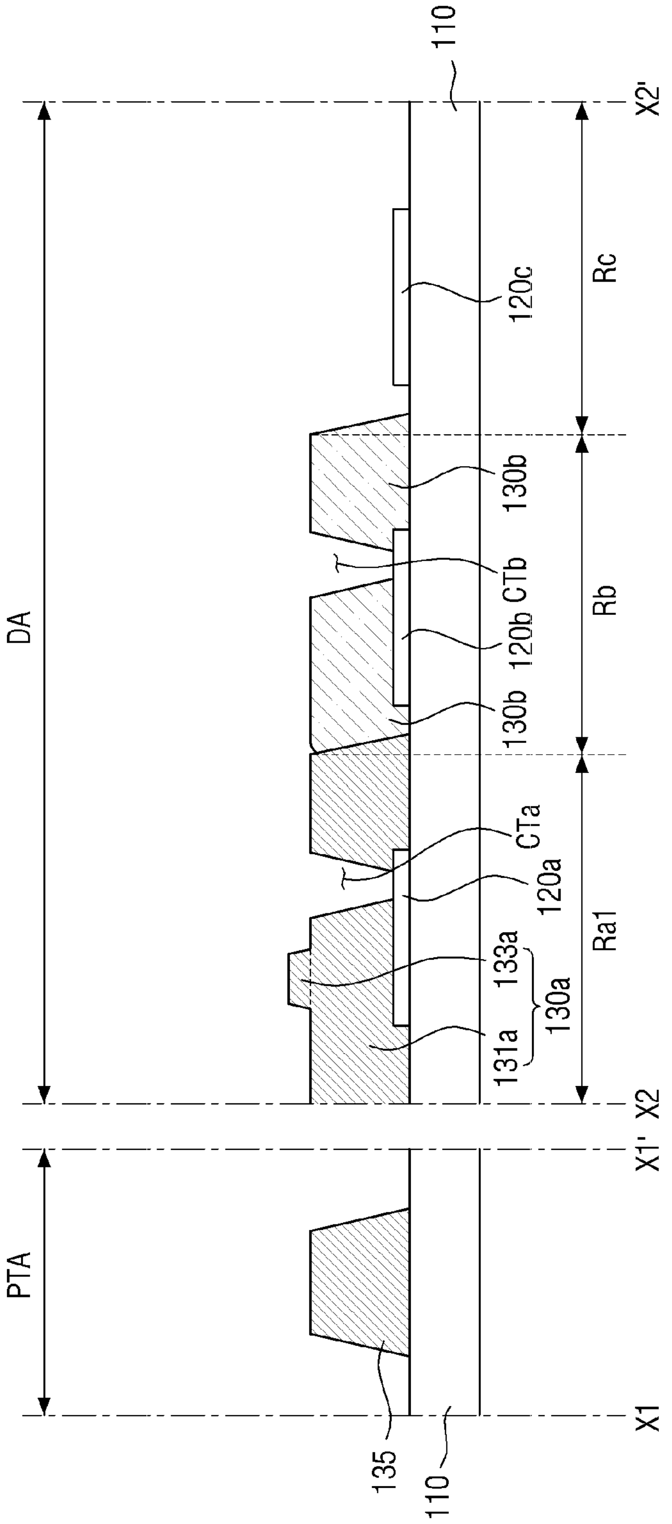

Subsequently, the part of the second photosensitive material layer ORG2 that is not cured or not exposed to the light is removed, such that the second insulation layer 130*b* shown in FIGS. 18 and 19 can be formed. Additionally, a second contact hole CTb may be formed to expose a part of the second thin-film transistor 120*b*.

Figure 20:
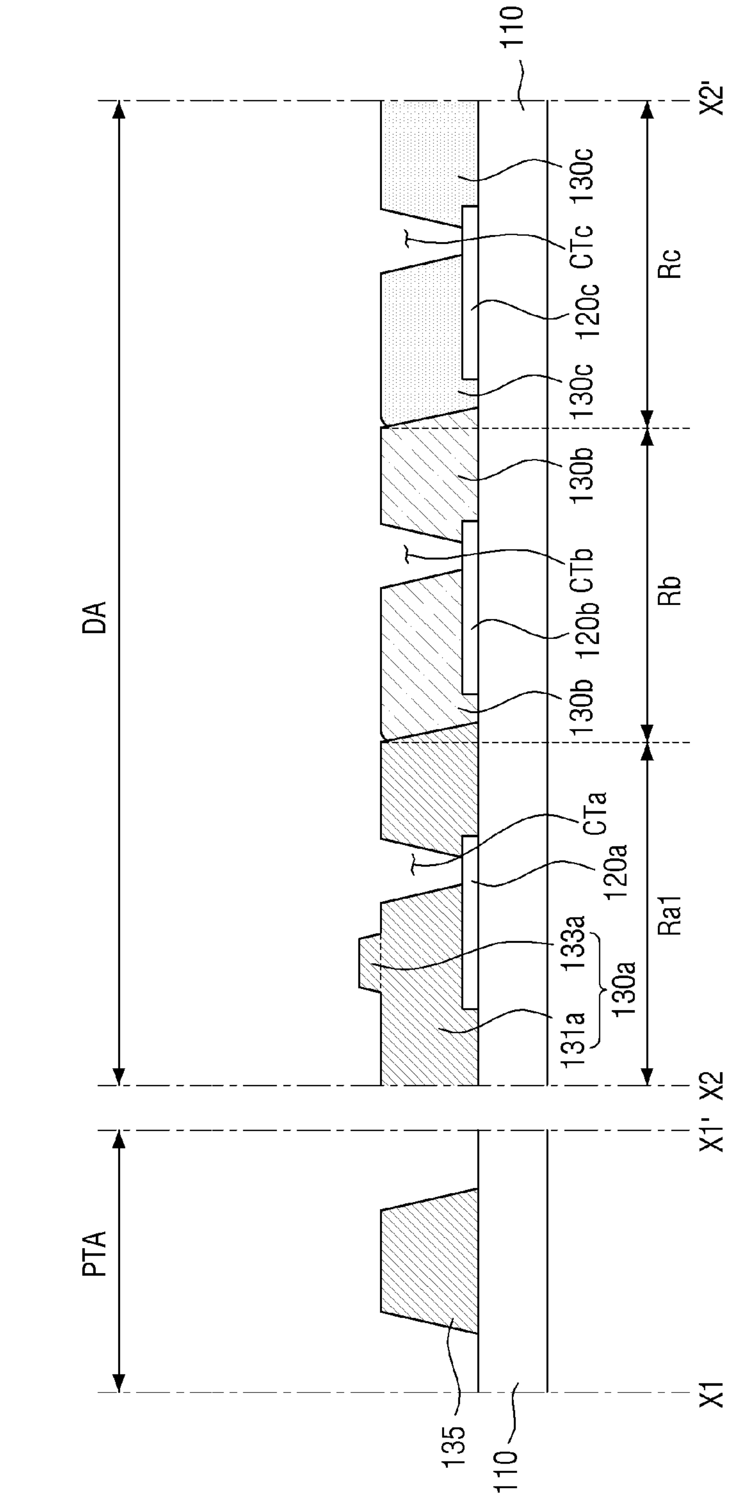

The third insulation layer 130*c* and the third contact hole CTc shown in FIG. 20 may be formed via the processes similar to the processes of forming the second insulation layer 130*b* and the second contact hole CTb. For example, a third photosensitive material light including a third color pigment may be applied onto the entire surface of the first base substrate 110, and exposure processes are formed part by part using a mask corresponding to the third pixel region Rx, thereby forming the third insulation layer 130*c* and the third contact hole CTc.

Figure 21:
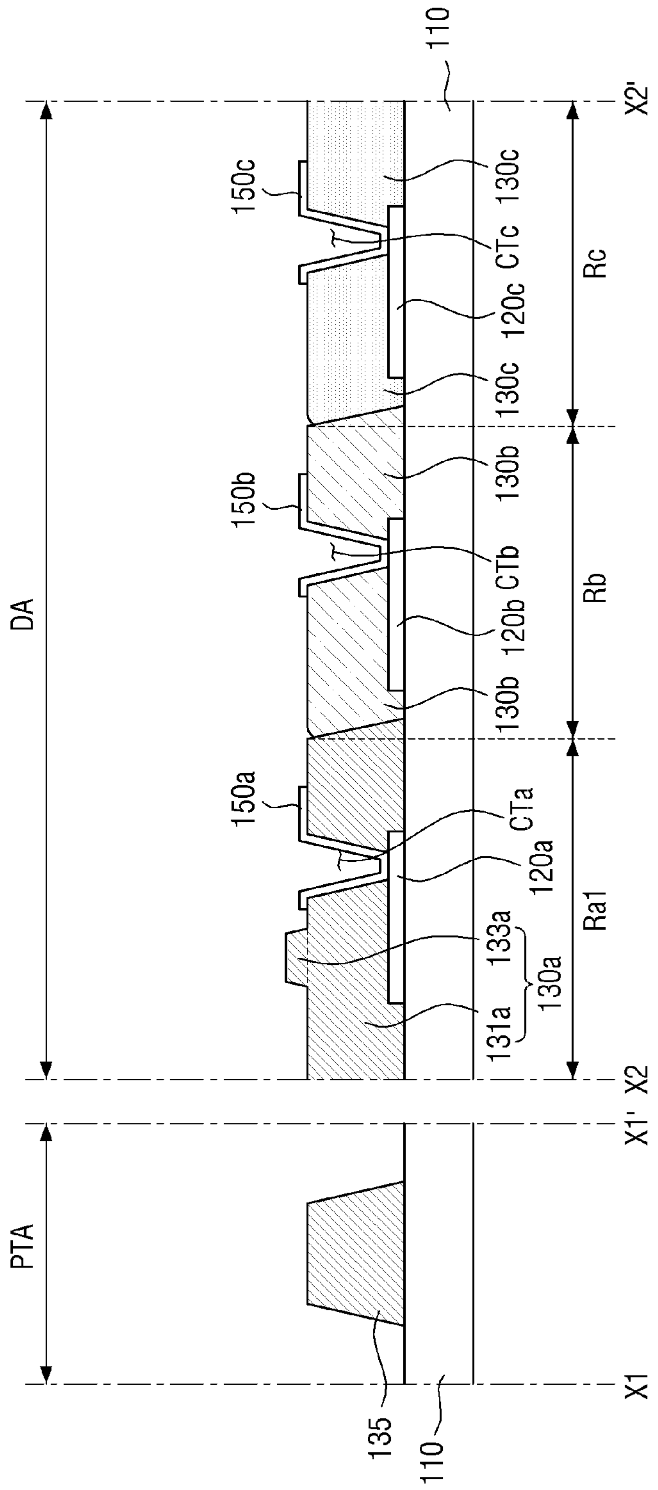
Figure 22:
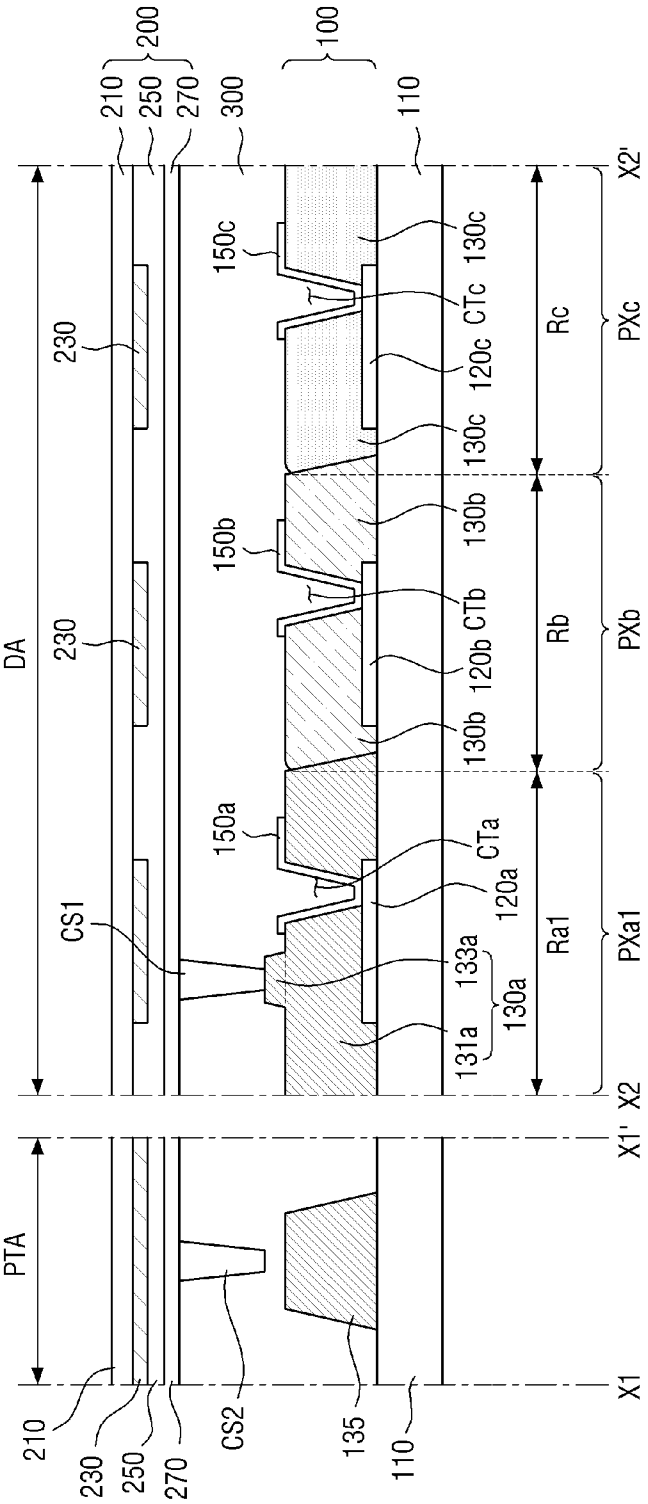

Subsequently, a transparent conductive film is formed throughout the entire surface of the first base substrate 110 including the first insulation layer 130*a*, the second insulation layer 130*b*, and the third insulation layer 130*c*, and then patterning is performed to form the first pixel electrode 150*a*, the second pixel electrode 150*b*, and the third pixel electrode 150*c* shown in FIG. 21. Finally, the array substrate is produced.

The opposing substrate 200 described above with respect to FIGS. 1 to 3 is placed to face the array substrate 110, and the liquid-crystal layer 300 is sandwiched between the array substrate 100 and the opposing substrate 200, so that the display device 1 can be fabricated.

According to the exemplary embodiment, the display device 1 includes the first protruding pattern 135 disposed in the peripheral area PA, so that it is possible to suppress degradation in display quality caused when a cell gap is changed. In addition, it is possible to prevent a short circuit from being formed between the common electrode 270 and a component on the array substrate 100 or other defects when the opposing substrate 200 is dented down. That is, the display device 1 according to this exemplary embodiment can improve display quality and reliability. Moreover, a protruding portion such as the second portion 133*a* can be formed in the display area DA without using an additional halftone mask. Further, the second portion 133*a* can be utilized as one of spacing members.

Figure 23:
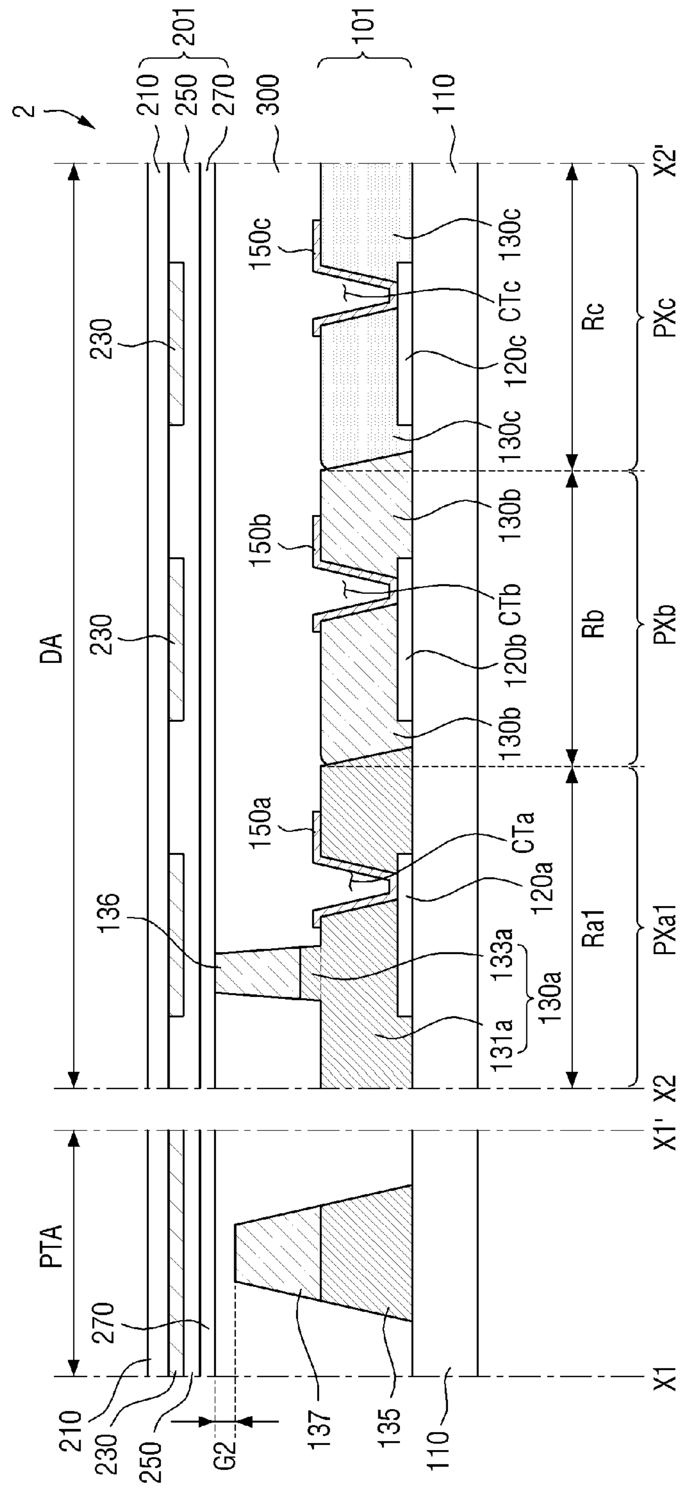
FIG. 23 is a cross-sectional view of the display device shown in FIG. 2, according to another exemplary embodiment.

FIG. 23 is a cross-sectional view of the display device shown in FIG. 2 according to another exemplary embodiment.

Referring to FIG. 23, the display device 2 may include an array substrate 101, an opposing substrate 201, and a liquid-crystal layer 300. The array substrate 101 is substantially similar to the array substrate 100 (see FIG. 2) described above with respect to FIGS. 1 to 3 except that the former further includes a second protruding pattern 137 that is located on the first protruding pattern 135 and an insulation pattern 136 that is located on the first insulation layer 130*a*. Therefore, in the following description, only differences will be described to avoid redundancy.

A first pixel PXa1 may further include the insulation pattern 136 located on a second portion 133*a*. The second protruding pattern 137 may be located on a first protruding pattern 135. The insulation pattern 136 and the second protruding pattern 137 may be made of the same material and may include a photosensitive material. In some embodiments, the insulation pattern 136 and the second protruding pattern 137 may include a color pigment that is different from a first color pigment included in a first insulation layer 130*a*. For example, the insulation pattern 136 and the second protruding pattern 137 may include a second color pigment, similar to a second insulation layer 130*b*. In addition, the insulation pattern 136 and the second protruding pattern 137 may be made of the same material as the second insulation layer 130*b*. In an alternative embodiment, the insulation pattern 136 and the second protruding pattern 137 may include a third color pigment, similar to a third insulation layer 130*c*. The insulation pattern 136 and the second protruding pattern 137 may be made of the same material as the third insulation layer 130*c*. In the following description, the insulation pattern 136 and the second protruding pattern 137 include the second color pigment for convenience of illustration. However, this is merely illustrative.

The second protruding pattern 137 may have an island shape when viewed from the top. In some embodiments, the shape of the second protruding pattern 137 may be substantially similar to the shape of the insulation pattern 136 when viewed from the top.

Figure 12:
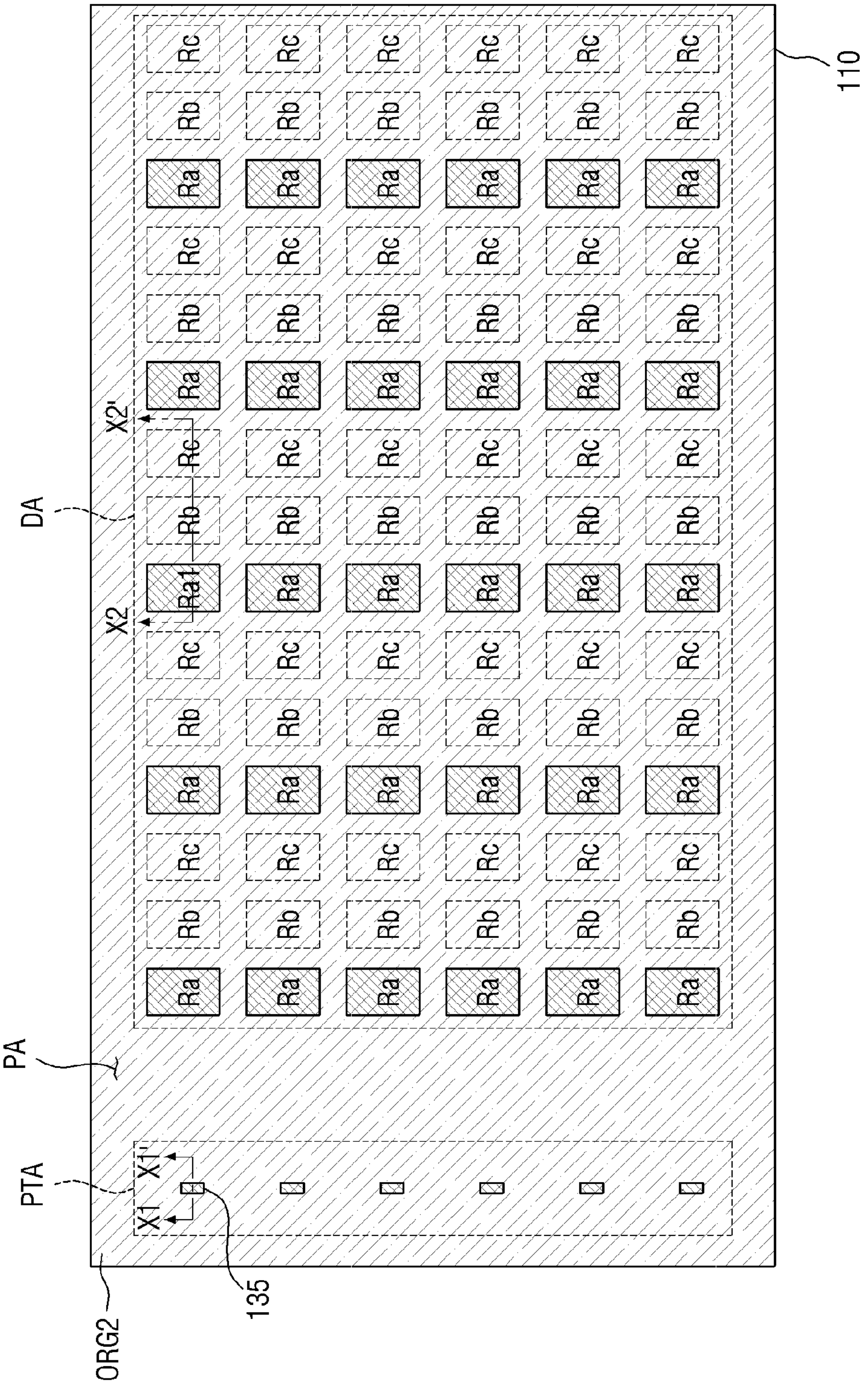
Figure 13:
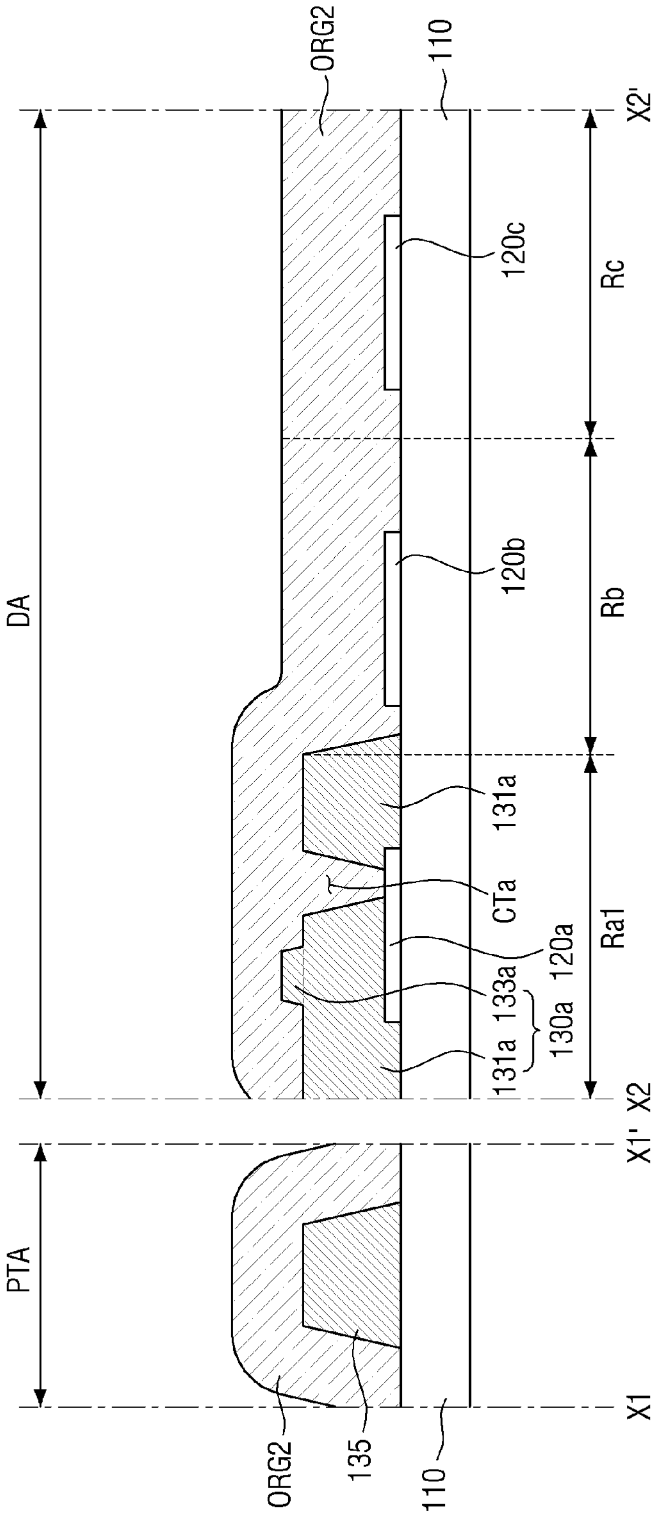

The insulation pattern 136 and the second protruding pattern 137 may be formed in such a manner that a pattern (or a light-transmitting part) corresponding to the protruding pattern region Rp is additional formed in the second mask Mb shown in FIGS. 12 and 13, and exposure processes are performed part by part using the second mask Mb.

The first portion 131*a* and the second portion 133*a* of the first insulation layer 130*a* and the first insulation pattern 136 may contact with the opposing substrate 210 in the display area DA and may work as a main spacer for maintaining a cell gap. The first protruding pattern 135 and the second protruding pattern 137 may be spaced apart from the opposing substrate 210 in the peripheral pattern area PTA by a gap G2 and may work as a sub spacer.

The opposing substrate 210 may include a second base substrate 210, a light-blocking member 230, a common electrode 270, and optionally an overcoat layer 250. The opposing substrate 201 according to this exemplary embodiment is substantially similar to the opposing substrate 200 described above with respect to FIGS. 1 to 3 except that the former may include only one or none of the first spacing member CS1 and the second spacing member CS2 (see FIG. 2). Therefore, descriptions of the identical elements will not be made to avoid redundancy.

Figure 24:
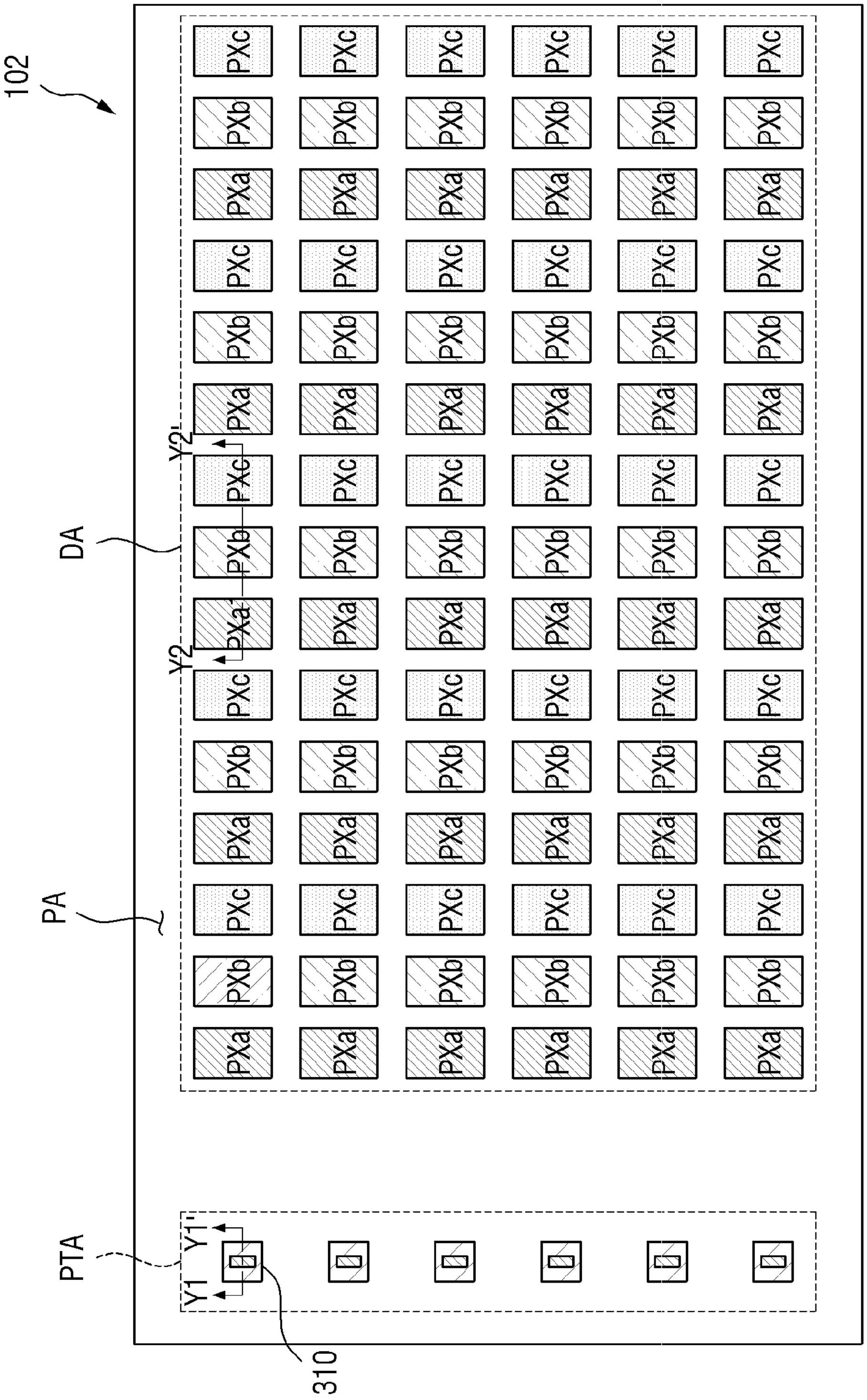
FIG. 24 is a plan view conceptually illustrating an array substrate, according to yet another exemplary embodiment.
Figure 25:
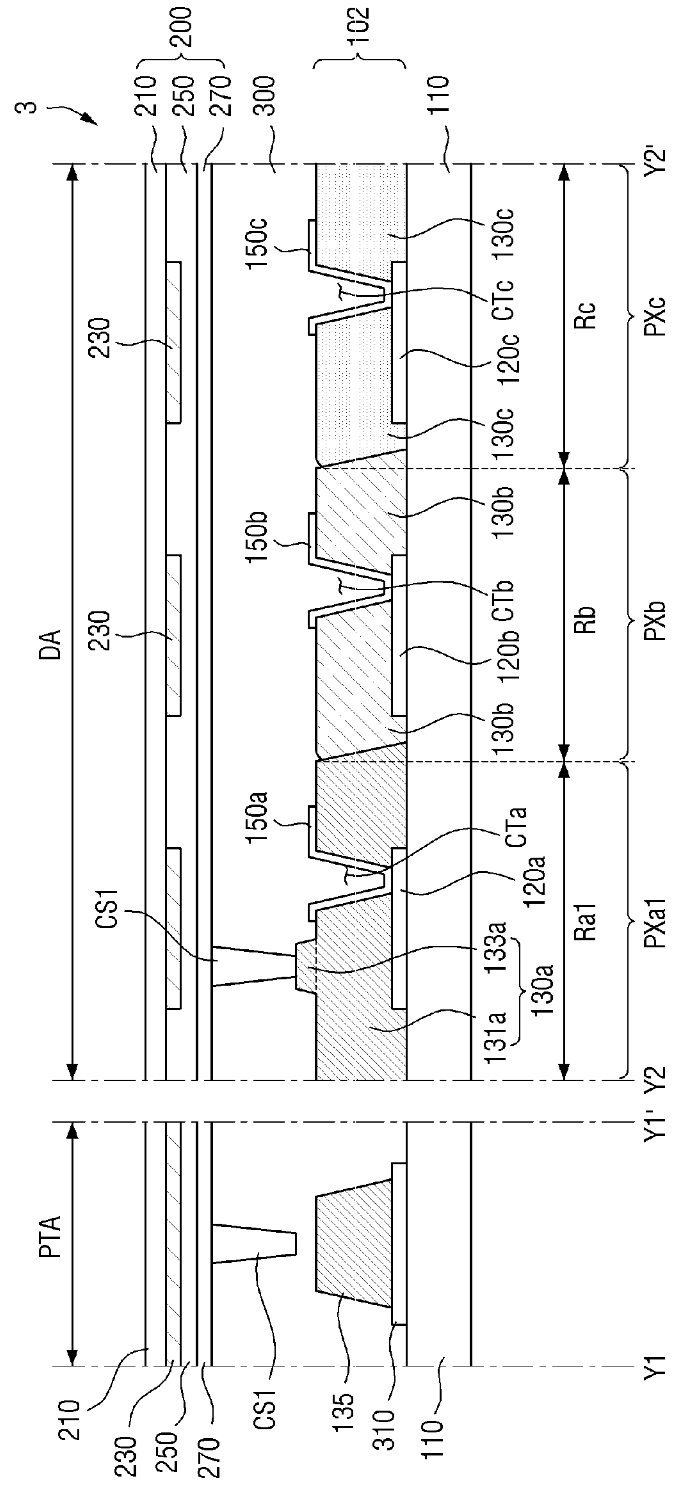
FIG. 25 is a cross-sectional view of a display device including the array substrate shown in FIG. 24, taken along lines Y1-Y1' and Y2-Y2'.

FIG. 24 is a plan view conceptually illustrating an array substrate, according to yet another exemplary embodiment. FIG. 25 is a cross-sectional view of a display device including the array substrate shown in FIG. 24, taken along lines Y1-Y1' and Y2-Y2'.

An array substrate 102 and a display device 3 including the same may be substantially similar to the display device 1 (see FIG. 1) described above with respect to FIGS. 1 to 3 except that a circuit part 310 is located in a peripheral area PA, especially in a peripheral pattern area PTA of a first base substrate 110. Therefore, descriptions of the identical elements will not be made to avoid redundancy.

Referring to FIGS. 24 and 25, the circuit part 310 may be located in the peripheral area PA, especially in the peripheral pattern area PTA of the first base substrate 110 where the first protruding pattern 135 is located. The first protruding pattern 135 may be located on the circuit part 310. The phrase that the first protruding pattern 135 is located on the circuit part 310 includes that the first protruding pattern 135 is located on at least a part of a material layer or a pattern of the circuit part 310.

Figure 26:
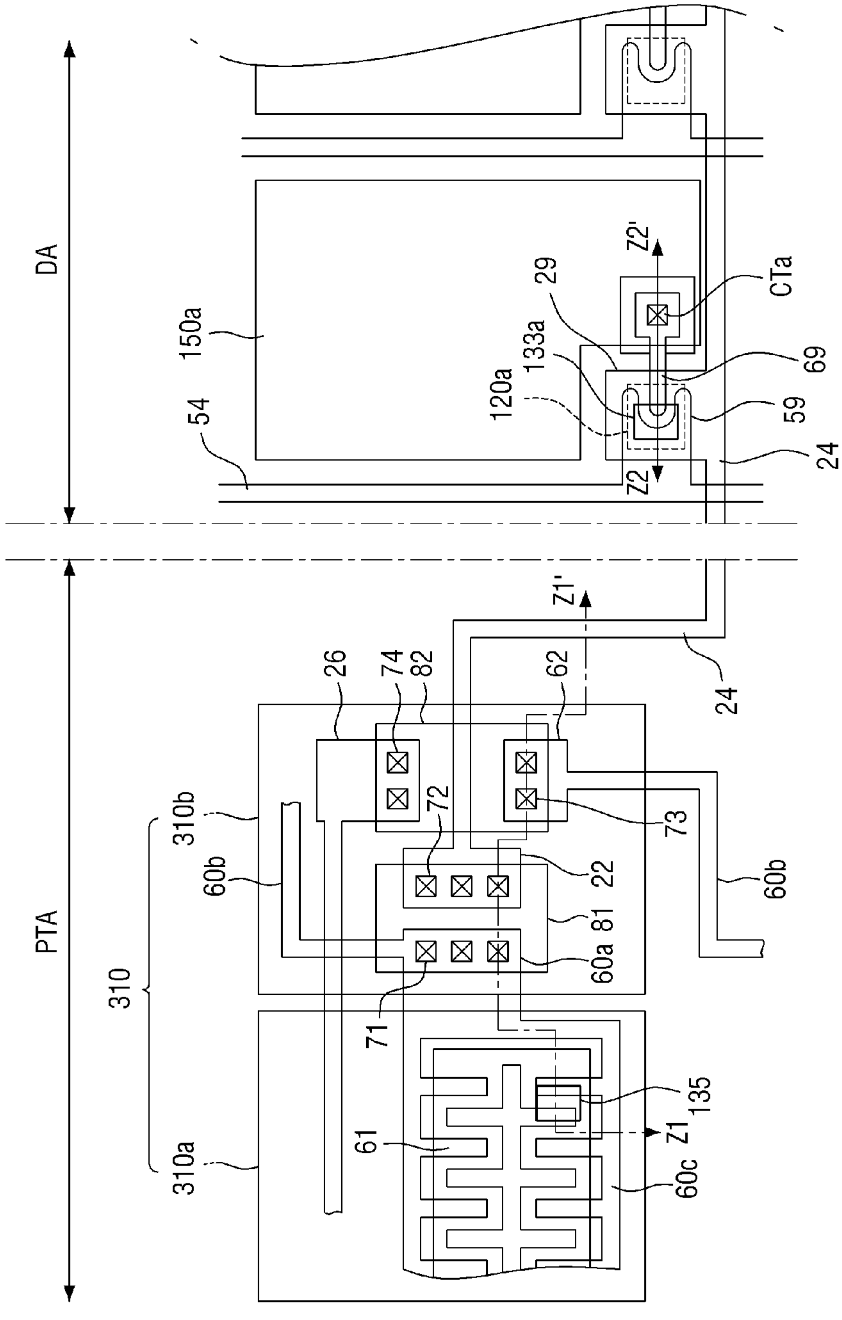
FIG. 26 is a view showing a layout of an array substrate where the circuit part shown in FIG. 25 has an amorphous silicon gate (ASG) structure.
Figure 27:
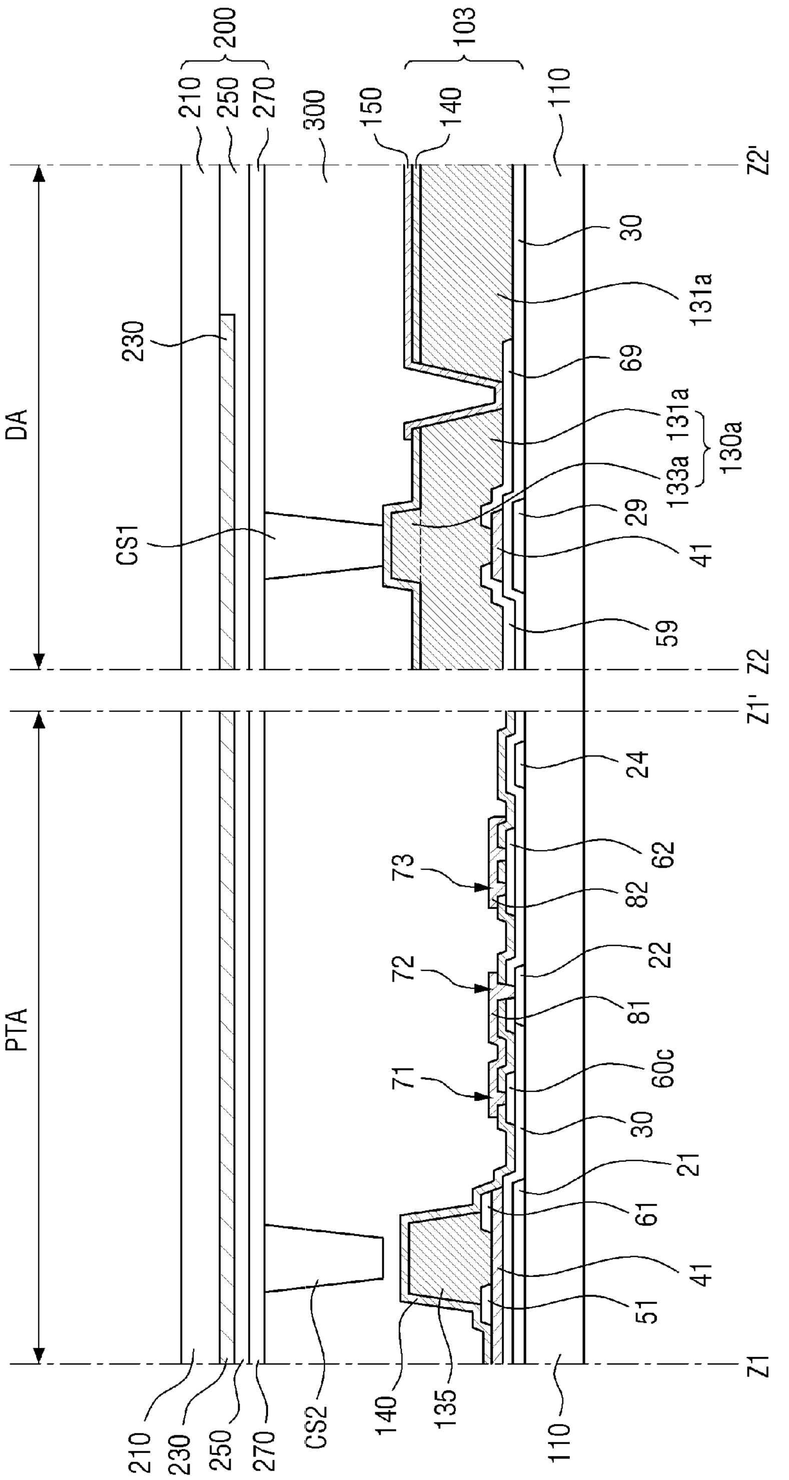
FIG. 27 is a schematic cross-sectional view of an example structure of the display device shown in FIG. 26 taken along lines Z1-Z1' and Z2-Z2'.

FIG. 26 is a view showing a layout of an array substrate when the circuit part shown in FIG. 25 has an amorphous silicon gate (ASG) structure. FIG. 27 is a schematic cross-sectional view of an exemplary embodiment of the structure of the display device shown in FIG. 26 taken along lines Z1-Z1' and Z2-Z2'.

Referring to FIGS. 26 and 27, in an array substrate 103 and a display device 4 including the same, the circuit part 310 may be a gate driving circuit. The gate driving circuit of the circuit part 310 may include a source electrode contact portion 60*a*, a gate line contact portion 22, a first source or drain line 60*b*, a first pad 62, a second pad 26, a gate line 24, a first bridge line 81, and a second bridge line 82.

Each of the thin-film transistors, for example, a first thin-film transistor 120*a* in a first pixel PXa1 may include a gate electrode 29, a semiconductor layer 41, a source electrode 59, and a drain electrode 69. The gate electrode 29 may be located on the first base substrate 110 and may be connected to a gate line 24 located on the first base substrate 110 to protrude therefrom. A gate insulation film 30 may be located on the gate line 24 and the gate electrode 29. The gate insulation film 30 may be made of an insulation material, for example, silicon nitride or silicon oxide. The semiconductor layer 41 may be located on the gate insulation film 30 and may overlap at least a part of the gate electrode 29. The semiconductor layer 41 may include amorphous silicon, polycrystalline silicon, or oxide semiconductor. A data line 54 may be located on the gate insulation film 30 such that it intersects the gate line 24. The data line 54 may transfer a data signal. The source electrode 59 may branch off from the data line 54 and may overlap at least a part of the gate electrode 29.

The drain electrode 69 may be spaced apart from the source electrode 59 with the semiconductor layer 41 therebetween, and may overlap at least a part of the gate electrode 29. The gate electrode 29, the source electrode 59 and the drain electrode 69, along with the semiconductor layer 41, may form a thin-film transistor, e.g., the first thin-film transistor 120*a*. A channel of the first thin-film transistor 120*a* may be a part of the semiconductor layer 41 between the source electrode 59 and the drain electrode 69.

The source electrode contact portion 60*a* may be connected to a second source or drain line 60*c* of a gate signal transmission transistor of the circuit part 310. In doing so, the second source or drain line 60*c* may be extended toward the display area DA, so that the source electrode contact portion 60*a* and the second source or drain line 60*c* may be formed as a single piece. On the other hand, the first source or drain line 60*b* is connected to the source electrode contact portion 60*a*, such that a gate output signal supplied from the first source electrode 61 of the gate signal transmission transistor may be transferred to a previous stage.

The source electrode contact portion 60*a* may be connected to the gate line contact portion 22 such that a gate output signal supplied from the first source electrode 61 may be transferred to a gate electrode 29 of a thin-film transistor formed in each of pixels in the display area DA, e.g., a first thin-film transistor 120*a* in the first pixel PXa1. Although the source electrode contact portion 60*a* is formed on the gate insulation film 30 while the gate line contact portion 22 is formed under the gate insulation film 30, they may be electrically connected to each other via the first bridge line 81.

A passivation film 140 may be formed on the source electrode contact portion 60*a* and the gate insulation film 30. The passivation film 140 may be formed by depositing silicon oxide or silicon nitride. The passivation film 140 may be eliminated.

When the passivation film 140 is formed on the source electrode contact portion 60 and the gate insulation film 30, the source electrode contact portion 60*a* and the gate line contact portion 22 may be connected to each other via the first bridge line 81 by forming a first contact hole 71 in the passivation film 140 and the gate insulation film 30. The first bridge line 81 may be formed on the passivation film 140. The gate line 24 is connected to the gate line contact portion 22 such that a gate output signal transferred from the source electrode contact portion 60*a* via the first bridge line 81 may be transferred to the gate electrode 29 via the gate line 24.

As shown in the drawings, the first pad 62 may be connected to the first source or drain line 60*b* of a subsequent stage and may receive a gate output signal from the subsequent stage. The first pad 62 may be disposed on one side of the gate line 24 and the second pad 26 may be disposed on the other side of the gate line 24. The second pad 26 may be connected to the first pad 62 and may receive a gate output signal from a subsequent stage. The first pad 62 may be electrically connected to the second pad 26 via the second bridge line 82. The first pad 62 may be formed on the gate insulation film 30 while the second pad 26 may be formed under the gate insulation film 30.

That is, the second pad 26 may be formed in the layer where the gate electrode 29 is formed. The passivation layer 140 may be formed on the first pad 62. The gate insulation film 30 and the passivation film 140 may be formed on the second pad 26. Accordingly, the first pad 62 and the second pad 26 are connected to the second bridge line 82 via a third contact hole 73 formed on the first pad 62 and a fourth contact hole 74 formed on the second pad 26. The first and second pads 62 and 26 may be connected to the second bridge line 82 via the third and fourth contact holes 73 and 74, respectively. The second bridge line 82 may be formed on the passivation film 140.

As shown in FIG. 26, the circuit part 310 may include a contact area 310*b* and a wiring area 310*a*. The first insulation pattern 135 may be formed in the wiring area 310*a* not to overlap the plurality of contact holes 71, 72, 73, and 74 formed in the contact area 310*b*. The contact area 310*b* may refer to an area where the plurality of contact holes 71, 72, 73, and 74 for electrically connecting wirings formed in the circuit part 310 to one another are formed densely. Although contacts for electrically connecting wiring layers to one another may be formed in the wiring area 310*a* as well, the contacts in the contact area 310*b* are more densely formed than those in the wiring area 310*a*. If the circuit part 310 is a gate driving circuit including an ASG circuit, the contact holes 71, 72, 73, and 74 in the contact area 310*b* may receive a gate signal from a subsequent stage via the first and second bridge lines 81 and 82 or may transfer a gate signal to a previous stage.

As described above, the first insulation pattern 135 may be formed in the wiring area 310*a* such that it does not overlap the plurality of contact holes 71, 72, 73, and 74 formed in the contact area 310*b*. If the first protruding pattern 135 is disposed in the contact area 310*b*, the contact holes 71, 72, 73, and 74 are formed during a subsequent process to penetrate the first protruding pattern 135. The contact holes 71, 72, 73 and 74 in the contact area 310*b* penetrate the passivation layer 140, or the gate insulation film 30 and the passivation film 140, as shown in FIGS. 26 and 27. However, in the display device 4, the first protruding pattern 135 is disposed such that it does not overlap the contact area 310*b* or the plurality of contact holes 71, 72, 73, and 74. Therefore, the process of forming the contact hole in the circuit part 310 becomes simpler.

In addition, as the first protruding pattern 135 is formed in the circuit part 310, it is possible to prevent the common electrode 270 from being in contact with the circuit part 310 even if the opposing substrate 200 is dented down. As a result, the possibility of defects is lowered and thus reliability of the display device can be improved.

Figure 28:
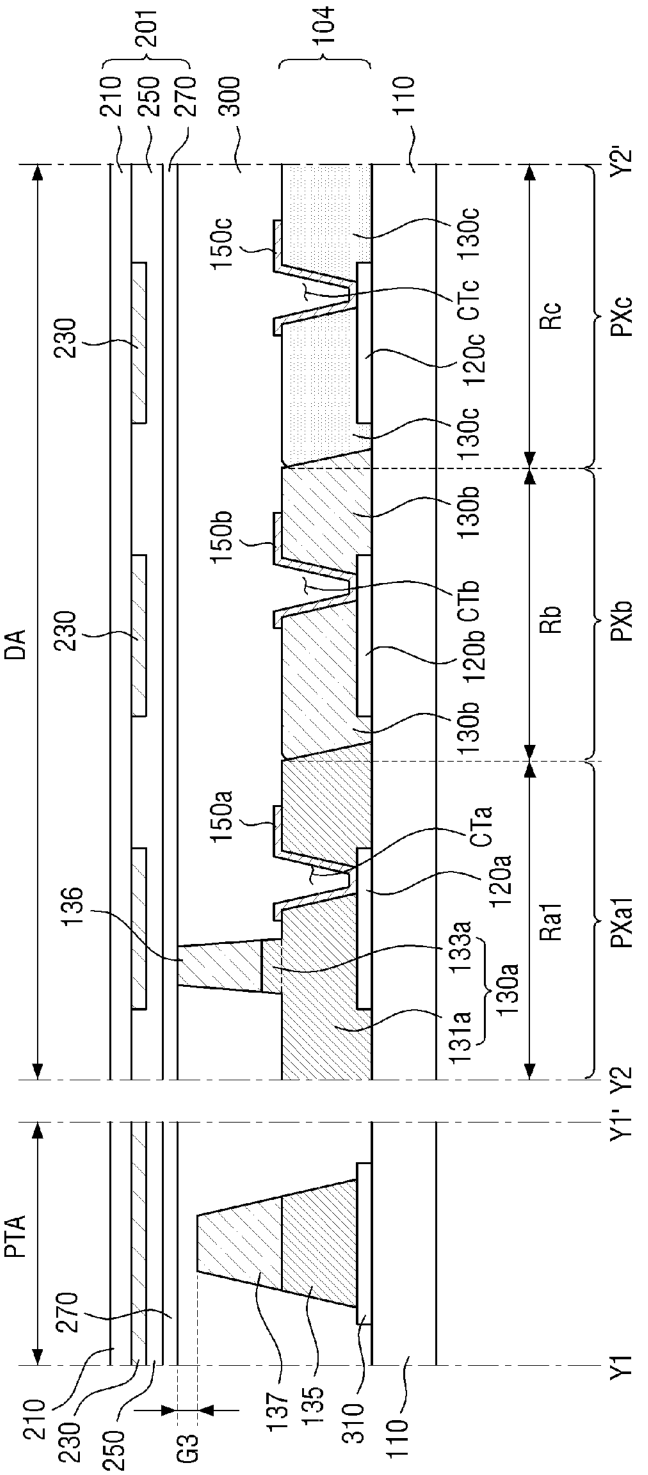
FIG. 28 is a cross-sectional view of the display device shown in FIG. 25, according to another exemplary embodiment.

FIG. 28 is a cross-sectional view of the display device shown in FIG. 25 according to another exemplary embodiment. The display device 5 may include an array substrate 104, an opposing substrate 201, and a liquid-crystal layer 300. The array substrate 104 is substantially similar to the array substrate 102 described above with respect to FIG. 25 except that the former further includes a second protruding pattern 137 that is located on the first protruding pattern 135 and an insulation pattern 136 that is located on the first insulation layer 130*a*. The second protruding pattern 137 and the insulation pattern 136 are substantially similar to those described above with respect to FIG. 23. Therefore, descriptions of the identical elements will not be made to avoid redundancy.

The opposing substrate 201 may include a second base substrate 210, a light-blocking member 230, a common electrode 270, and optionally an overcoat layer 250. The opposing substrate 210 may be substantially similar to the opposing substrate described above with respect to FIG. 23. That is, the opposing substrate 210 may include only one or none of the first spacing member CS1 and the second spacing member CS2 (see FIG. 2).

Although the exemplary embodiments of the present disclosure have been disclosed for illustrative purposes, those skilled in the art would appreciate that various modifications and substitutions may be made without departing from the scope and spirit of the disclosure. For example, elements of the exemplary embodiment of the present disclosure may be modified. Such modifications and substitutions are also construed as falling within the scope of the present disclosure.

What is claimed is:

1. An array substrate comprising:

a base substrate comprising a display area and a peripheral area;

a thin-film transistor disposed in the display area of the base substrate;

an insulation layer disposed in the display area of the base substrate, the insulation layer comprising a first portion, covering the thin-film transistor and a second portion located on the first portion; and a first protruding pattern disposed in the peripheral area of the base substrate, wherein the first portion, the second portion, and the first protruding pattern comprise the same material, and wherein a thickness of the first protruding pattern is substantially equal to a thickness of the first portion.

2. The array substrate of claim 1, wherein the first portion, the second portion, and the first protruding pattern comprise a photosensitive material.

3. The array substrate of claim 1, wherein the first portion, the second portion, and the first protruding pattern comprise the same color pigment.

4. The array substrate of claim 1, wherein the first protruding pattern has an island shape in a plan view.

5. The array substrate of claim 1, wherein a shape of the second portion is substantially similar to a shape of the first protruding pattern in a plan view.

6. The array substrate of claim 1, wherein the second portion overlaps the thin-film transistor.

7. The array substrate of claim 1, further comprising:

an insulation pattern disposed on the second portion; and a second protruding pattern disposed on the first protruding pattern.

8. The array substrate of claim 7, wherein a material of the insulation pattern is the same as that of the second protruding pattern and is different from that of the insulation layer.

9. The array substrate of claim 7, wherein the insulation layer comprises a first color pigment, and wherein the second protruding pattern comprises a second color pigment that is different from the first color pigment.

10. The array substrate of claim 1, further comprising; a circuit part disposed in the peripheral area of the base substrate, wherein the circuit part comprises a plurality of contacts for electrically connecting wirings formed in the circuit part to one another, and wherein the first protruding pattern does not overlap the plurality of contacts.

11. The array substrate of claim 10, wherein the circuit part comprises a gate driving circuit for transmitting a gate signal to the display area, and wherein the gate driving circuit is an amorphous silicon gate (ASG) circuit.

12. An array substrate comprising:

a base substrate comprising a display area and a peripheral area;

a thin-film transistor disposed in the display area of the base substrate;

an insulation layer disposed in the display area of the base substrate, the insulation layer comprising a first portion covering the thin-film transistor and a second portion located on the first portion; and a first protruding pattern, disposed in the peripheral area of the base substrate, wherein the first portion, the second portion, and the first protruding pattern comprise the same material, and wherein a hardness of an overlapping portion of the first portion on which the second portion is located is higher than a hardness of the first protruding, pattern.

13. An array substrate comprising:

a base substrate comprising a display area and a peripheral area;

a thin-film transistor disposed in the display area of the base substrate;

an insulation layer disposed in the display area of the base substrate, the insulation layer comprising a first portion covering the thin-film transistor and a second portion located on the first portion; and a first protruding pattern disposed in the peripheral area of the base substrate, wherein the first portion, the second portion, and the first protruding pattern comprise the same material, and wherein a hardness of an overlapping portion of the first portion on which the second portion is located is higher than a hardness of a non-overlapping portion of the first portion.

14. A display device comprising:

an array substrate:

an opposing substrate facing the array substrate and comprising a light-blocking member; and a liquid-crystal layer interposed between the array substrate and the opposing substrate, wherein the array substrate comprises:

a first base substrate comprising a display area and a peripheral area;

a thin-film transistor disposed in the display area of the first base substrate;

an insulation layer disposed in the display area of the first base substrate, the insulation layer comprising a first portion covering the thin-film transistor and a second portion protruding from the first portion toward the opposing substrate and overlapping the light-blocking member; and a protruding pattern disposed in the peripheral area of the first base substrate and protruding toward the opposing substrate, and wherein the first portion, the second portion, and the protruding pattern comprise the same material, and wherein a hardness of an overlapping portion of the first portion on which the second portion is located is higher than a hardness of the protruding pattern.

15. The display device of claim 14, wherein the opposing substrate further comprises a first spacing member overlapping the second portion.

16. The display device of claim 15, wherein the opposing substrate further comprises a second spacing member overlapping the protruding pattern, and a thickness of the second spacing member is substantially equal to a thickness of the first spacing member.

17. The display device of claim 14, wherein the second portion overlaps the thin-film transistor.

18. The display device of claim 14, wherein the array substrate further comprises a circuit part disposed in the peripheral area of the first base substrate, and wherein the circuit part comprises a plurality of contacts for electrically connecting wirings formed in the circuit part to one another, and the protruding pattern does not overlap the plurality of contacts.

* * * * *